United States Patent
Pan et al.

(10) Patent No.: US 12,125,898 B2
(45) Date of Patent: Oct. 22, 2024

(54) SEMICONDUCTOR DEVICE AND MANUFACTURING METHOD THEREOF

(71) Applicant: TAIWAN SEMICONDUCTOR MANUFACTURING COMPANY, LTD., Hsinchu (TW)

(72) Inventors: Sheng-Liang Pan, Hsinchu (TW); Yung-Tzu Chen, Hsinchu (TW); Chung-Chieh Lee, Taipei (TW); Yung-Chang Hsu, Hsinchu (TW); Chia-Yang Hung, Kaohsiung (TW); Po-Chuan Wang, Taipei (TW); Guan-Xuan Chen, Taoyuan (TW); Huan-Just Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 276 days.

(21) Appl. No.: 17/358,606

(22) Filed: Jun. 25, 2021

(65) Prior Publication Data
US 2022/0320311 A1 Oct. 6, 2022

Related U.S. Application Data

(60) Provisional application No. 63/167,939, filed on Mar. 30, 2021.

(51) Int. Cl.
*H01L 29/66* (2006.01)
*H01L 21/762* (2006.01)
*H01L 29/417* (2006.01)
*H01L 29/51* (2006.01)

(52) U.S. Cl.
CPC .... *H01L 29/6656* (2013.01); *H01L 21/76224* (2013.01); *H01L 29/41783* (2013.01); *H01L 29/511* (2013.01); *H01L 29/66795* (2013.01)

(58) Field of Classification Search
CPC .......... H01L 29/6656; H01L 21/76224; H01L 29/41783; H01L 29/511; H01L 29/66795
See application file for complete search history.

(56) References Cited

U.S. PATENT DOCUMENTS

| | | | | |
|---|---|---|---|---|
| 7,303,946 B1* | 12/2007 | Ozawa | .............. | H01L 29/40114 438/770 |
| 2010/0327281 A1* | 12/2010 | Nakajima | ............... | H01L 29/04 257/E21.414 |
| 2019/0131436 A1* | 5/2019 | Cheng | ................. | H01L 29/7851 |
| 2020/0105620 A1* | 4/2020 | Tan | ................... | H01L 21/02532 |

* cited by examiner

*Primary Examiner* — Jay C Kim
*Assistant Examiner* — Woo K Lee
(74) *Attorney, Agent, or Firm* — Birch, Stewart, Kolasch & Birch, LLP

(57) ABSTRACT

A method includes forming a gate structure on a semiconductor substrate; depositing a carbon-containing seal layer over the gate structure; depositing a nitrogen-containing seal layer over the carbon-containing seal layer; introducing an oxygen-containing precursor on the nitrogen-containing seal layer; heating the substrate to dissociate the oxygen-containing precursor into an oxygen radical to dope into the nitrogen-containing seal layer; after heating the substrate, etching the nitrogen-containing seal layer and the carbon-containing seal layer, such that a remainder of the nitrogen-containing seal layer and the carbon-containing seal layer remains on a sidewall of the gate structure as a gate spacer.

20 Claims, 20 Drawing Sheets

SEMICONDUCTOR DEVICE AND MANUFACTURING METHOD THEREOF

PRIORITY CLAIM AND CROSS-REFERENCE

This application claims priority to U.S. Provisional Application Ser. No. 63/167,939, filed Mar. 30, 2021, which is herein incorporated by reference in its entirety.

BACKGROUND

The semiconductor integrated circuit (IC) industry has experienced rapid growth. Technological advances in IC materials and design have produced generations of ICs. Each generation has smaller and more complex circuits than the previous generation.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
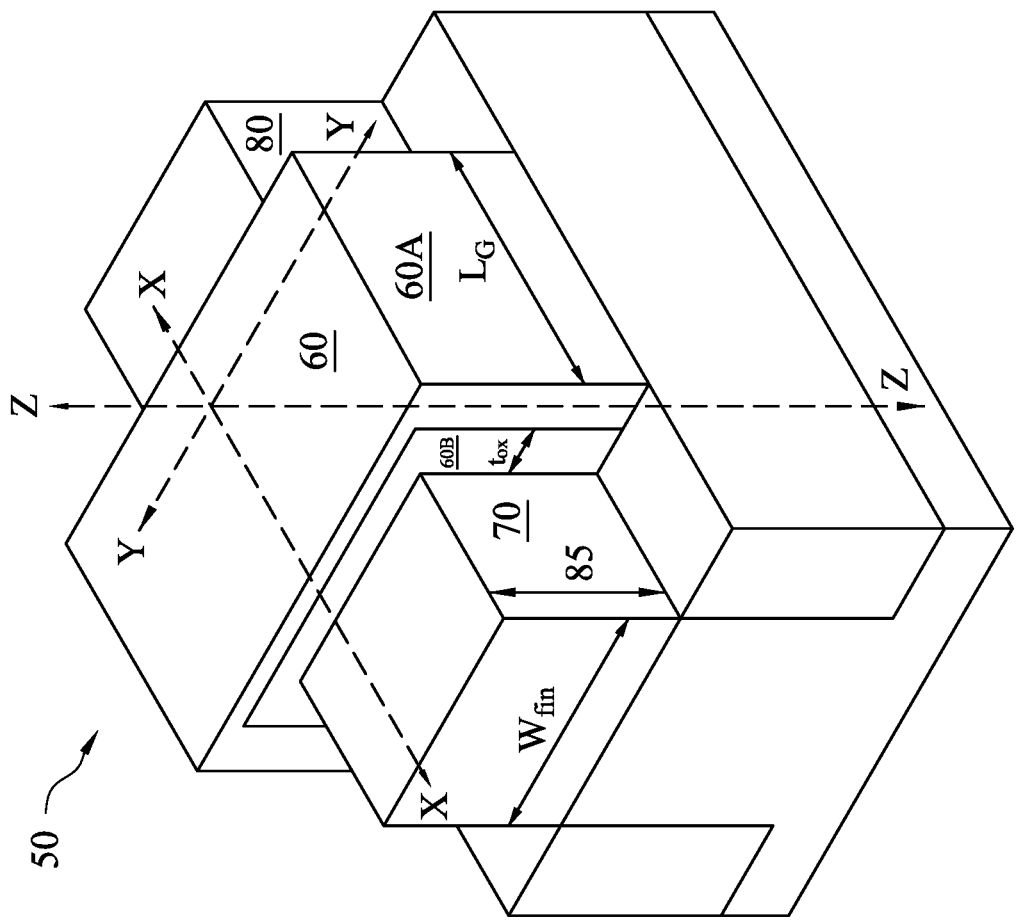
FIG. 1A is a perspective view of an example FinFET device.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments of the present disclosure are directed to, but not otherwise limited to, a fin-like field-effect transistor (FinFET) device. The FinFET device, for example, may be a complementary metal-oxide-semiconductor (CMOS) device including a P-type metal-oxide-semiconductor (PMOS) FinFET device and an N-type metal-oxide-semiconductor (NMOS) FinFET device. The following disclosure will continue with one or more FinFET examples to illustrate various embodiments of the present disclosure. It is understood, however, that the application should not be limited to a particular type of device, except as specifically claimed.

The fins may be patterned by any suitable method. For example, the fins may be patterned using one or more photolithography processes, including double-patterning or multi-patterning processes. The double-patterning or the multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

In order to resist against etching processes on a gate structure, a multi-layered seal structure is formed over the gate structure. The multi-layered seal structure may have an upper seal layer and an underlying ultra-low-k seal layer. In some embodiments, the upper seal layer may further be oxidized, using an $O_2$ plasma process, to prevent the upper seal layer from the poison effect due to a subsequent photo process which may result in $NH_3$ outgassing from the upper seal layer. However, oxidizing the upper seal layer by using the $O_2$ plasma process may also oxidize the underlying seal layer because the $O_2$ plasma in the plasma process may penetrate through the upper seal layer and further through the underlying seal layer. Subsequently, the succeeding wet clean process, such as that using hydrofluoric acid (HF), may damage the oxidized underlying ultra-low-k seal layer.

Therefore, the present disclosure in various embodiments provides a non-plasma treatment, such as an ozone heating method, for forming an oxidized seal layer over the ultra-low-k seal layer. An advantage is that an oxygen radical generated from an oxygen-containing ambient may selectively oxidize the upper seal layer rather than the underlying ultra-low-k seal layer, so as to prevent damage to the underlying ultra-low-k seal layer during subsequent processes, which may in turn allow for improving the resistive-capacitive (RC) time delay of the semiconductor device.

FIG. 1A is a perspective view of an example FinFET device. The use of FinFET devices has been gaining popularity in the semiconductor industry. Referring to FIG. 1A, a perspective view of an example FinFET device 50 is illustrated. The FinFET device 50 is a non-planar multi-gate transistor that is built over a substrate (such as a bulk substrate). A thin silicon-containing "fin-like" structure (hereinafter referred to as a "fin") forms the body of the FinFET device 50. The fin extends along an X-direction shown in FIG. 1A. The fin has a fin width $W_{fin}$ measured along a Y-direction that is orthogonal to the X-direction. A gate 60 of the FinFET device 50 wraps around this fin, for example around the top surface and the opposing sidewall surfaces of the fin. Thus, a portion of the gate 60 is located over the fin in a Z-direction that is orthogonal to both the X-direction and the Y-direction.

$L_G$ denotes a length (or width, depending on the perspective) of the gate 60 measured in the X-direction. The gate 60 may include a gate electrode component 60A and a gate dielectric component 60B. The gate dielectric 60B has a thickness $t_{ox}$ measured in the Y-direction. A portion of the gate 60 is located over a dielectric isolation structure such as shallow trench isolation (STI). A source 70 and a drain 80 of the FinFET device 50 are formed in extensions of the fin on opposite sides of the gate 60. A portion of the fin being wrapped around by the gate 60 serves as a channel of the FinFET device 50. The effective channel length of the FinFET device 50 is determined by the dimensions of the fin.

Figure 1B:
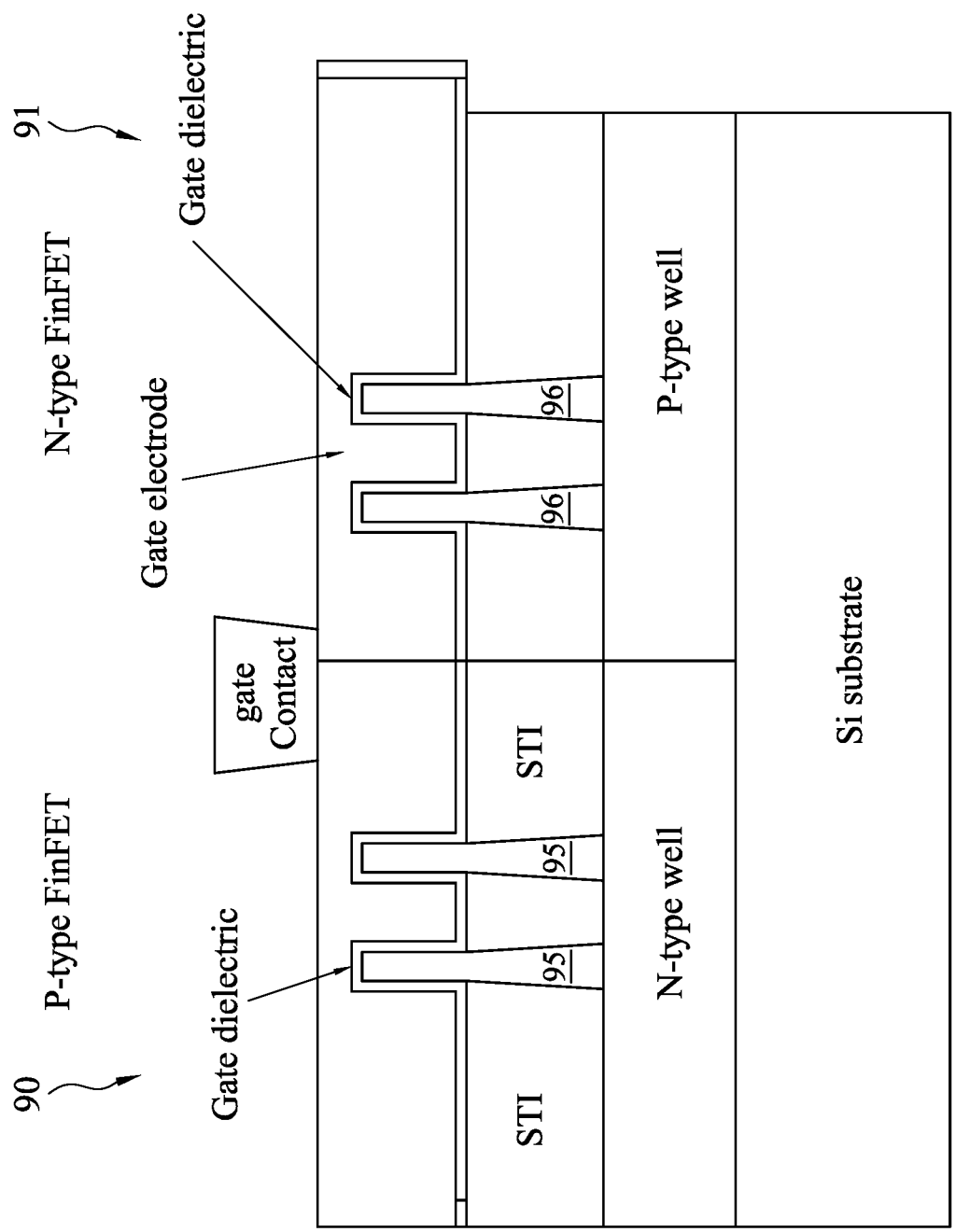
FIG. 1B is a diagrammatic cross-sectional side view of FinFET transistors in a CMOS configuration.

FIG. 1B illustrates a diagrammatic cross-sectional side view of FinFET transistors in a CMOS configuration. The CMOS FinFET includes a substrate, for example a silicon substrate. An N-type well and a P-type well are formed in the substrate. A dielectric isolation structure such as a shallow trench isolation (STI) is formed over the N-type well and the P-type well. A P-type FinFET 90 is formed over the N-type well, and an N-type FinFET 91 is formed over the P-type well. The P-type FinFET 90 includes fins 95 that protrude upwardly out of the STI, and the N-type FinFET 91 includes fins 96 that protrude upwardly out of the STI. The fins 95 include the channel regions of the P-type FinFET 90, and the fins 96 include the channel regions of the N-type FinFET 91. In some embodiments, the fins 95 are comprised of silicon germanium, and the fins 96 are comprised of silicon. A gate dielectric is formed over the fins 95-96 and over the STI, and a gate electrode is formed over the gate dielectric. In some embodiments, the gate dielectric includes a high-k dielectric material, and the gate electrode includes a metal gate electrode, such as aluminum and/or other refractory metals. In some other embodiments, the gate dielectric may include SiON, and the gate electrode may include polysilicon. A gate contact is formed on the gate electrode to provide electrical connectivity to the gate.

Figure 2:
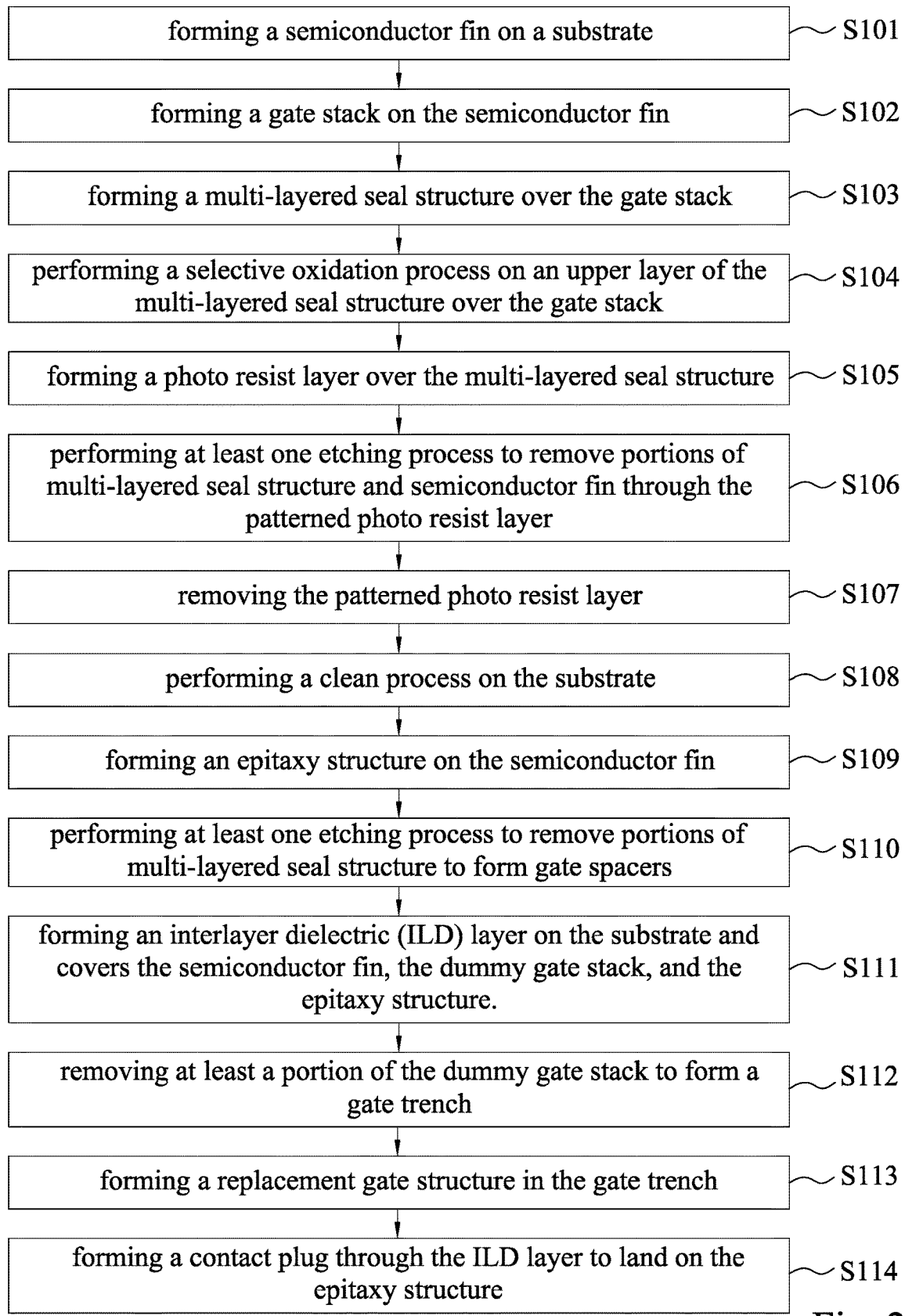
FIG. 2 is a flowchart of a method for forming a semiconductor device in accordance with some embodiments of the present disclosure.

Referring now to FIG. 2, illustrated is a flowchart of an exemplary method M for fabrication of a semiconductor device in accordance with some embodiments. The method M includes a relevant part of the entire manufacturing process. It is understood that additional operations may be provided before, during, and after the operations shown by FIG. 2, and some of the operations described below can be replaced or eliminated for additional embodiments of the method. The order of the operations/processes may be interchangeable. The method M includes fabrication of a semiconductor device. However, the fabrication of the semiconductor device is merely an example for describing the manufacturing process according to some embodiments of the present disclosure.

Figure 3:
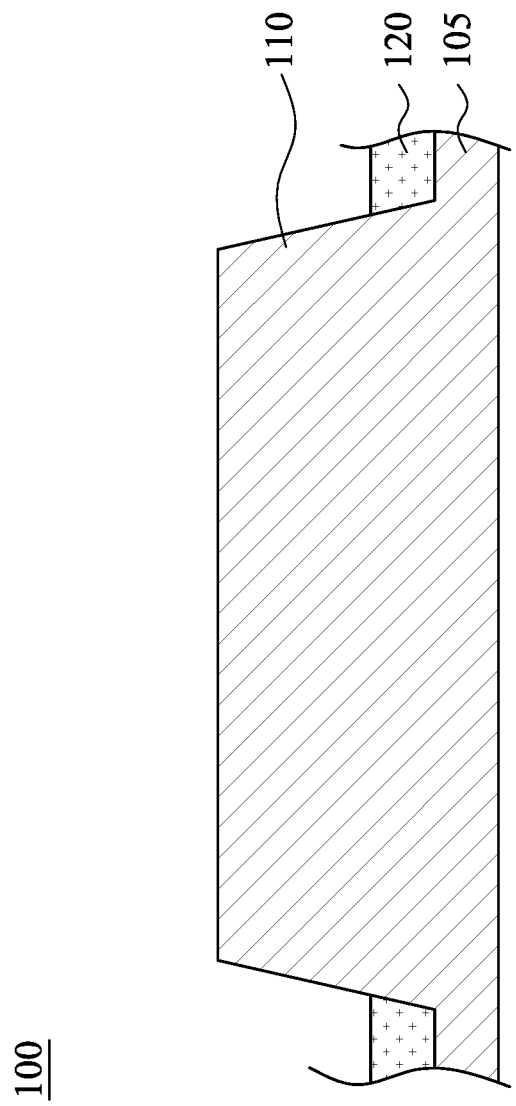
FIGS. 3 to 15 illustrate a method in various stages of forming a semiconductor device in accordance with some embodiments of the present disclosure.

FIGS. 3-15 illustrate the method M in various stages of forming a semiconductor device 100 in accordance with some embodiments of the present disclosure. The method M begins at block S101. Referring to FIG. 3, in some embodiments of block S101, a semiconductor fin 110 is formed on a substrate 105 and protrudes from the substrate 105. In some embodiments, the substrate 105 includes silicon. Alternatively, the substrate 105 may include germanium, silicon germanium, gallium arsenide or other appropriate semiconductor materials. Also alternatively, the substrate 105 may include an epitaxial layer. For example, the substrate 105 may have an epitaxial layer overlying a bulk semiconductor. Further, the substrate 105 may be strained for performance enhancement. For example, the epitaxial layer may include a semiconductor material different from that of the bulk semiconductor, such as a layer of silicon germanium overlying bulk silicon or a layer of silicon overlying bulk silicon germanium. Such a strained substrate may be formed by selective epitaxial growth (SEG). Furthermore, the substrate 105 may include a semiconductor-on-insulator (SOI) structure. Also alternatively, the substrate 105 may include a buried dielectric layer, such as a buried oxide (BOX) layer, such as that formed by separation by implantation of oxygen (SIMOX) technology, wafer bonding, SEG, or another appropriate method.

In some embodiments, the semiconductor fin 110 includes silicon. The semiconductor fin 110 may be formed, for example, by patterning and etching the substrate 105 using photolithography techniques. In some embodiments, a layer of photoresist material (not shown) is sequentially deposited over the substrate 105. The layer of photoresist material is irradiated (exposed) in accordance with a desired pattern (the semiconductor fin 110 in this case) and developed to remove portions of the photoresist material. The remaining photoresist material protects the underlying material from subsequent processing steps, such as etching. It is noted that other masks, such as an oxide or silicon nitride mask, may also be used in the etching process.

An isolation dielectric 120 is formed to fill trenches between the semiconductor fins 110 as shallow trench isolation (STI). The isolation dielectric 120 may include any suitable dielectric material, such as silicon oxide. The method of forming the isolation dielectric 120 may include depositing an isolation dielectric 120 on the substrate 105 to cover the semiconductor fin 110, optionally performing a planarization process, such as a chemical mechanical polishing (CMP) process, to remove the excess isolation dielectric 120 outside the trenches, and then performing an etching process on the isolation dielectric 120 until upper portions of the semiconductor fins 110 are exposed. In some embodiments, the etching process performed may be a wet etching process, such as that in which the substrate 105 is dipped in hydrofluoric acid (HF). In alternative embodiments, the etching process may be a dry etching process. For example, the dry etching process may be performed using $CHF_3$ or $BF_3$ as the etching gas.

Figure 4:
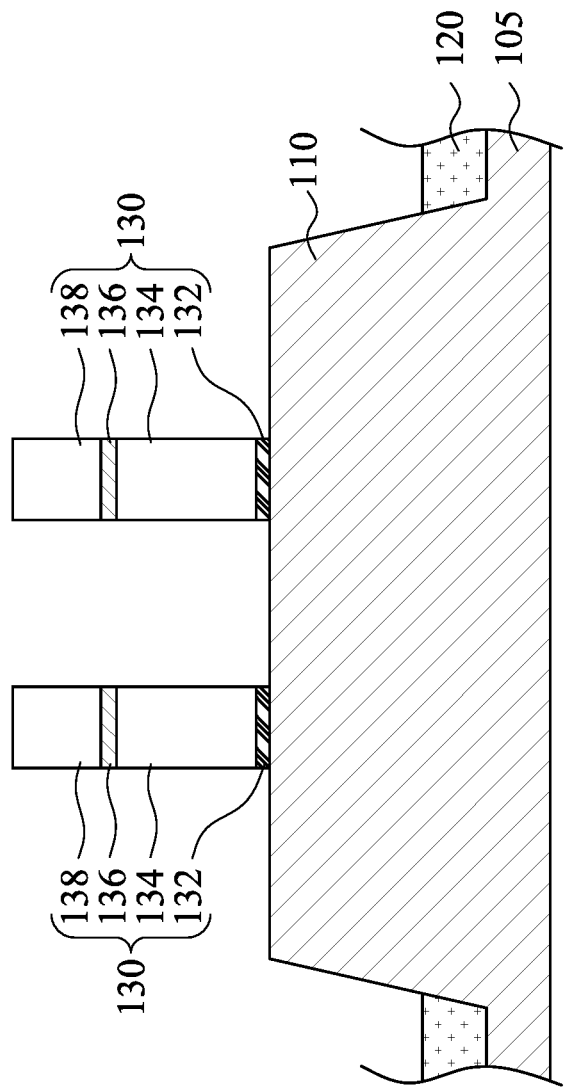

Referring back to FIG. 2, the method M then proceeds to block S102 where a gate stack is formed on the semiconductor fin. With reference to FIG. 4, in some embodiments of block S102, gate stacks 130 are formed on portions of the semiconductor fin 110 at intervals, such that other portions of the semiconductor fin 110 are exposed. In some embodiments using a gate-last process, the gate stacks 130 are dummy gates and at least portions thereof will be replaced by final gate stacks at a subsequent stage. For example, portions of the dummy gate stacks 130 may be replaced at a subsequent stage by metal gate electrodes (MG) after high temperature thermal processes, such as thermal annealing for source/drain activation during the formation of sources/drains.

In some embodiments, the dummy gate stacks 130 include gate dielectrics 132, dummy electrodes 134, dielectric caps 136, and gate masks 138. In some embodiments, the gate dielectrics 132 may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof. In some embodiments, the gate dielectrics 132 may include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof. In alternative embodiments, the gate dielectrics 132 may have a multilayer structure such as one layer of silicon oxide (e.g., interfacial layer) and another layer of high-k material. The dummy electrodes 134 may include polycrystalline silicon (polysilicon), as an example. The dielectric caps 136 may include a suitable dielectric material, such as silicon nitride, silicon oxynitride or silicon carbide, as examples. The gate masks 138 may include a suitable dielectric material, such as silicon nitride, silicon oxynitride or silicon carbide, as examples. In some embodiments, the gate masks 138 may have a material different than the dielectric caps 136.

The dummy gate stacks 130 can be formed by deposition and patterning. For example, the gate dielectric 132 is blanket deposited on the structure shown in FIG. 3 by a suitable technique, such as chemical vapor deposition (CVD). The dummy electrode 134 is deposited on the gate dielectric 132 by a suitable technique, such as CVD. The dielectric cap 136 is deposited on the dummy gate electrode 134 by a suitable technique, such as CVD. The gate mask 138 is deposited on the dielectric cap 136 by a suitable technique, such as CVD. Next, the gate mask 138 is patterned by a lithography process and an etching process, thereby forming openings in the gate mask 138, and exposing the underlying dielectric cap materials within the openings. The lithography process may include photoresist (or resist) coating (e.g., spin-on coating), soft baking, mask aligning, exposure, post-exposure baking, developing the photoresist, rinsing, drying (e.g., hard baking), other suitable processes, and/or combinations thereof. The etching process includes dry etching, wet etching, and/or other etching methods (e.g., reactive ion etching). Another etching process is applied to the dielectric cap materials and dummy gate materials through the openings of the gate mask 138 using the gate mask 138 as an etch mask, thereby forming the gate stacks 130 straddling portions of the semiconductor fin 110.

Figure 5:
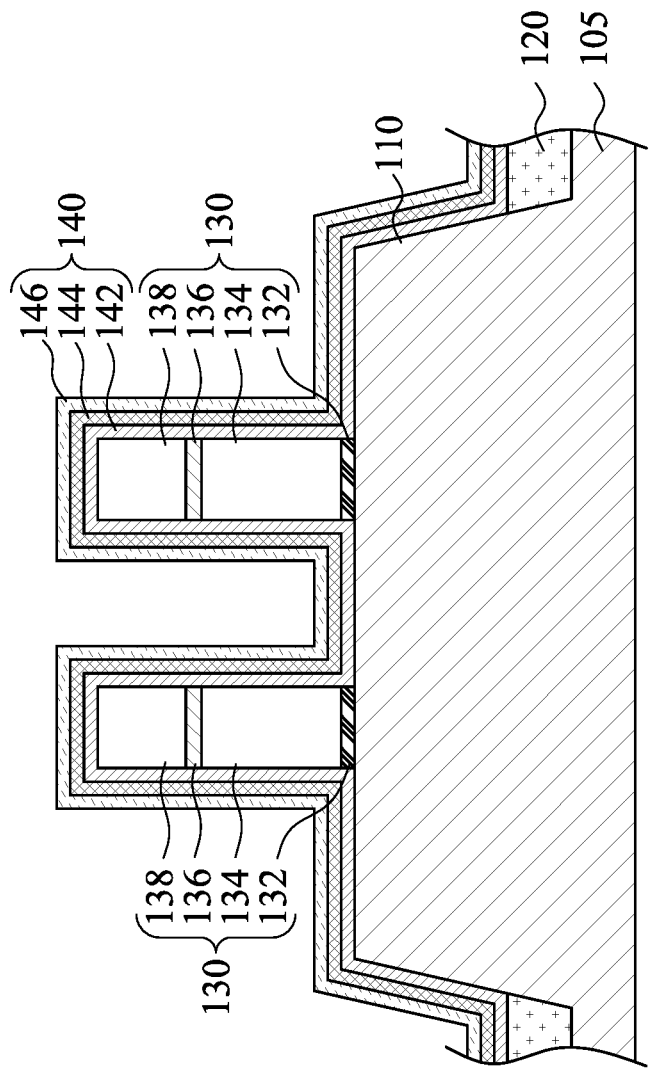

Referring back to FIG. 2, the method M then proceeds to block S103 where a multi-layered seal structure is formed over the gate stack. With reference to FIG. 5, in some embodiments of block S103, a multi-layered seal structure 140 is formed over the structure shown in FIG. 4. In FIG. 5, the multi-layered seal structure 140 includes a first seal layer 142, a second seal layer 144, and a third seal layer 146, by way of example but not limiting the present disclosure.

The first seal layer 142 is formed over the structure shown in FIG. 4. That is, the first seal layer 142 is conformally formed over at least the semiconductor fin 110 and the dummy gate stacks 130. In some embodiments, the first dielectric layer 142 includes a dielectric material, which may be advantageous to resist against subsequent etching processes, such as etching in a gate replacement process. In some embodiments, the first seal layer 142 may include low-k carbon-containing materials such as, for example, silicon oxycarbonitride (SiOCN), silicon oxycarbide (SiOC), silicon carbide (SiC), or other suitable dielectric materials. In some embodiments, the first seal layer 142 may include porous dielectric materials. In some embodiments, the first seal layer 142 may include other low-k dielectric materials, such as carbon doped silicon dioxide, low-k silicon nitride, low-k silicon oxynitride, polyimide, spin-on glass (SOG), fluoride-doped silicate glass (FSG), phosphosilicate glass (PSG), borophosphosilicate glass (BPSG), Xerogel, Aerogel, amorphous fluorinated carbon, Parylene, BCB (bis-benzocyclobutenes), other suitable low-k dielectric materials, and/or combinations thereof. In some embodiments, the first seal layer 142 may be formed by a deposition process, such as an atomic layer deposition (ALD) process, a physical vapor deposition (PVD) process, a sputter deposition process, a chemical vapor deposition (CVD) process such as plasma enhanced CVD (PECVD), low pressure CVD (LPCVD), atomic layer CVD (ALCVD), or other suitable techniques.

Subsequently, the second seal layer 144 is formed on the first seal layer 142, and the second seal layer 144 is conformal to the first seal layer 142. In some embodiments, the second seal layer 144 includes a dielectric material, which may be advantageous to reduce a parasitic capacitance between a metal gate stack and a contact plug formed in subsequent steps. A resistive-capacitive (RC) time delay caused by the parasitic capacitance, therefore, can be decreased. In some embodiments, the second seal layer 144 may be made of a material different than that of the first seal layer 142. In some embodiments, the second seal layer 144 has a dielectric constant less than that of the first seal layer 142. For example, the second seal layer 144 may include a low-k dielectric material having a dielectric constant less than a dielectric constant of silicon oxide ($SiO_2$), which is about 3.9. In some embodiments, the material of the second seal layer 144 can be interchangeably referred to as an ultra-low-k dielectric material. In some embodiments, the dielectric constant of the second seal layer 144 may range from about 2.8 to about 3.8, and the dielectric constant of the first seal layer 142 may range from about 5.5 to about 6.5. Moreover, the second seal layer 144 and the first seal layer 142 may have different etch properties. For example, the first and second seal layers 142 and 144 have different etch resistance properties. That is, the first seal layer 142 may be made of a material which has higher etch resistance to an etchant used to etch the second seal layer 144, which in turn allows for resisting against subsequent etching processes, such as etching in a gate replacement process.

In some embodiments, the second seal layer 144 may include low-k carbon-containing materials such as, for example, silicon oxycarbonitride (SiOCN), silicon oxycarbide (SiOC), silicon carbide (SiC), or other suitable dielectric materials. In some embodiments, the second seal layer 144 may include porous dielectric materials. In some embodiments, the second seal layer 144 may include other low-k dielectric materials, such as carbon doped silicon dioxide, low-k silicon nitride, low-k silicon oxynitride, polyimide, spin-on glass (SOG), fluoride-doped silicate glass (FSG), phosphosilicate glass (PSG), borophosphosilicate glass (BPSG), Xerogel, Aerogel, amorphous fluorinated carbon, Parylene, BCB (bis-benzocyclobutenes), other suitable low-k dielectric materials, and/or combinations thereof. In some embodiments, the second seal layer 144 may be formed by a deposition process, such as an atomic layer deposition (ALD) process, a physical vapor deposition (PVD) process, a sputter deposition process, a chemical vapor deposition (CVD) process such as plasma enhanced CVD (PECVD), low pressure CVD (LPCVD), or atomic layer CVD (ALCVD), or other suitable techniques.

Subsequently, the third seal layer 146 is formed on the second seal layer 144, and the third seal layer 146 is conformal to the second seal layer 144. In some embodiments, the third seal layer 146 includes a dielectric material, which may be advantageous to resist against subsequent etching processes. In some embodiments, the third seal layer 146 may be made of a material different than that of the second seal layer 144. In some embodiments, the second seal layer 144 has a dielectric constant less than that of the third seal layer 146. In some embodiments, the dielectric constant of the third seal layer 146 may range from about 4.5 to about 5.5. Moreover, the third seal layer 146 and the second seal layer 144 may have different etch properties. For example, the second and third seal layers 144 and 146 have different etch resistance properties. That is, the third seal layer 146 may be made of a material which has higher etch resistance to an etchant used to etch the second seal layer 144, which in turn allows for resisting against subsequent etching processes.

In some embodiments, the third seal layer 146 may include oxide-free dielectric material. For example, the third seal layer 146 may include silicon nitride or another suitable material. In some embodiments, the third seal layer 146 may include carbon-free dielectric material. For example, the third seal layer 146 may include silicon oxide, silicon nitride, silicon oxy-nitride, or another suitable material. In some embodiments, the third dielectric layer 146 includes non-porous dielectric materials. In some embodiments, the third seal layer 146 may be formed by a deposition process, such as an atomic layer deposition (ALD) process, a physical vapor deposition (PVD) process, a sputter deposition process, a chemical vapor deposition (CVD) process such as plasma enhanced CVD (PECVD), low pressure CVD (LPCVD), or atomic layer CVD (ALCVD), or other suitable techniques.

Referring back to FIG. 2, the method M then proceeds to block S104 where a selective oxidation process is performed on an upper layer of the multi-layered seal structure over the gate stack. In order to resist against subsequent etching processes, the third seal layer 146 is formed over the ultra-low-k seal layer 144. The third seal layer 146 may further be oxidized, using an $O_2$ plasma process, to prevent the third seal layer 146 from the poison effect due to a subsequent photo process which may result in $NH_3$ outgassing from the third seal layer 146. However, oxidizing the third seal layer 146 by using the $O_2$ plasma process may oxidize the underlying seal layer 144 because the $O_2$ plasma in the plasma process may penetrate through the third seal layer 146 and further through the underlying seal layer 144. The subsequent wet clean process, such as that using hydrofluoric acid (HF), may damage the oxidized underlying seal layer 144.

Figure 6:
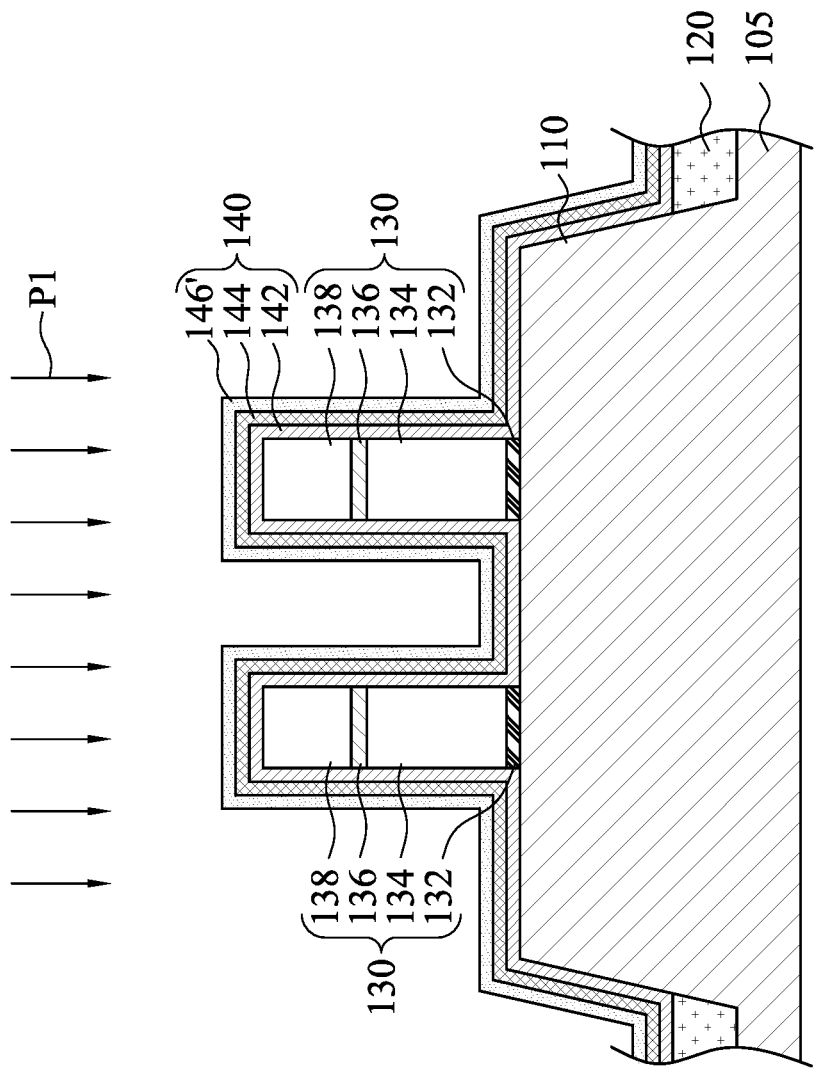

Therefore, the present disclosure in various embodiments provides a non-plasma treatment, such as an ozone heating method, for forming an oxidized seal layer 146' over the ultra-low-k seal layer 144 (see FIG. 6). An advantage is that an oxygen radical generated from an oxygen-containing ambient may selectively oxidize the seal layer 146 rather than the underlying ultra-low-k seal layer 144. Therefore, the subsequent wet clean process, such as that using hydrofluoric acid (HF), is prevented from damaging the underlying seal layer 144, which may in turn allow for improving the resistive-capacitive (RC) time delay of the semiconductor device.

Figure 18:
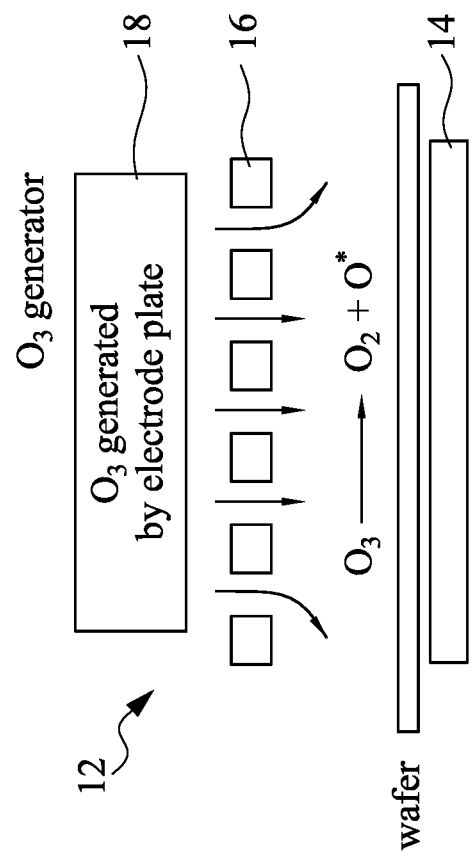
FIG. 18 is a schematic diagram of an oxidation system in accordance with some embodiments of the present disclosure.
Figure 19A:
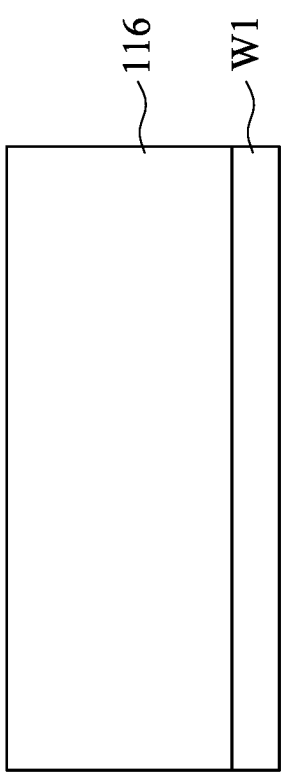
FIGS. 19A, 19B, 20A, and 20B are schematic views showing non-plasma oxidation processes performed on a silicon nitride layer and a silicon oxycarbide layer.
Figure 19B:
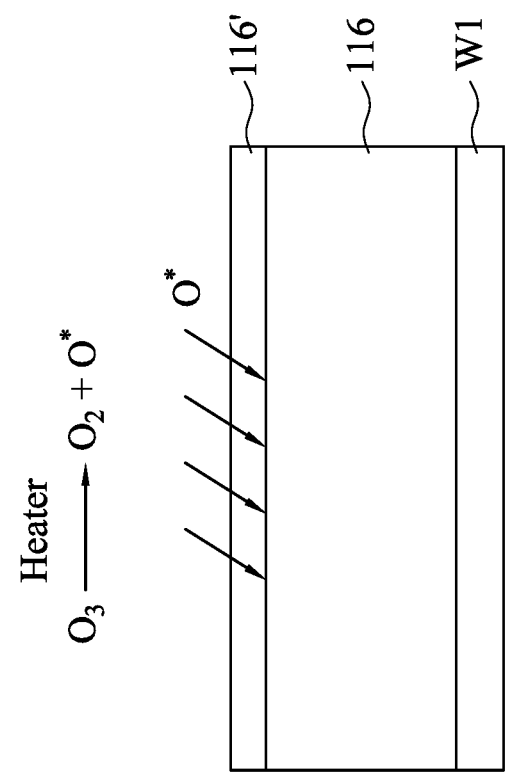
Figure 20A:
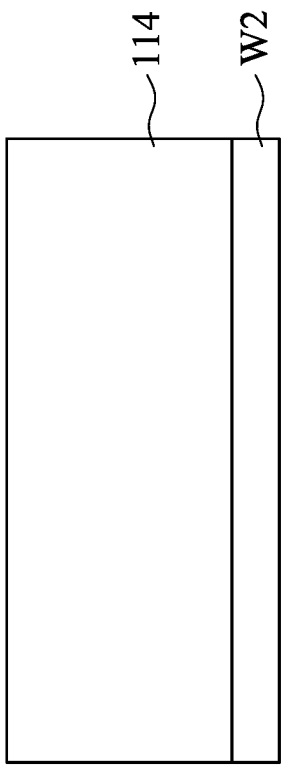
Figure 20B:
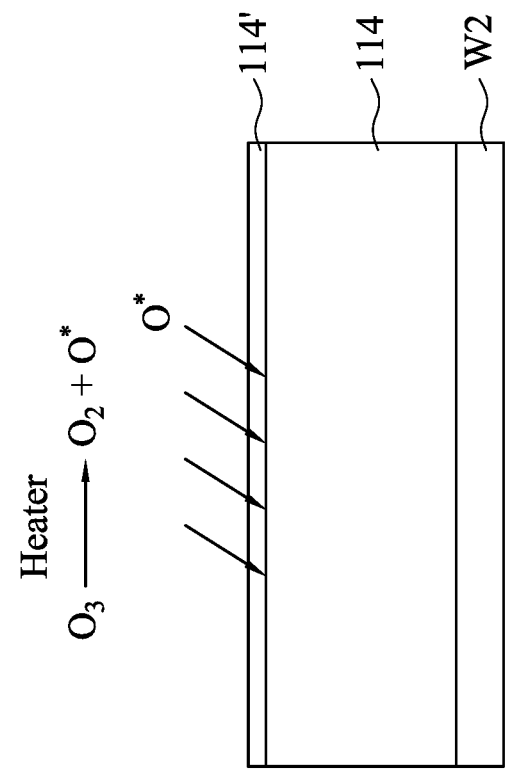

FIG. 18 is a schematic diagram of an oxidation system 10 in accordance with some embodiments of the present disclosure. FIGS. 19A, 19B, 20A, and 20B are schematic views showing non-plasma oxidation processes performed on a silicon nitride layer and a silicon oxycarbide layer. In FIG. 19A, a silicon nitride layer 116, is deposited over a substrate W1, and then a non-plasma oxidation process, such as an ozone heating treatment, is performed on the silicon nitride layer 116 as shown in FIG. 19B. In FIG. 20A, a silicon oxycarbide layer 114 is deposited over a substrate W2, and then the non-plasma oxidation process is performed on the silicon oxycarbide layer 114 as shown in FIG. 20B.

In some embodiments, the substrate W1 may include a semiconductor substrate, such as a bulk semiconductor, a semiconductor-on-insulator (SOI) substrate, or the like. An SOI substrate includes a layer of a semiconductor material formed on an insulator layer. The insulator layer may be, for example, a buried oxide (BOX) layer, a silicon oxide layer, or the like. The insulator layer is provided on a substrate, a silicon or glass substrate. Other substrates, such as a multi-layered or gradient substrate may also be used. In some embodiments, the semiconductor material of the substrate W1 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In some embodiments, the substrate W1 may be undoped or doped (e.g., p-type, n-type, or a combination thereof). Other materials, such as germanium, quartz, sapphire, and glass could alternatively be used for the substrate W1. In some embodiments, the substrate W2 as shown in FIG. 20A may be substantially the same as or comparable to that of the substrate W1 as shown in FIG. 19A.

In FIG. 19B, the ozone heating treatment is performed on the silicon nitride layer 116. The ozone heating treatment may include flowing steam ($H_2O$), oxygen ($O_2$), ozone ($O_3$), the like, or a combination thereof into a chamber 12 of an oxidation system 10 in which the substrate W1 is disposed as shown in FIG. 18. In some embodiments, the ozone may be generated remotely from the substrate W1 through a shower head 16 of the oxidation system 10 by an electrode plate 18, and flowed over the substrate W1 without subjecting the substrate W1 to plasma. Therefore, the ozone heating treatment can be interchangeably referred to as a non-plasma treatment. Subsequently, the ozone heating treatment may be performed to heat ozone, using a heater 14 of the oxidation system 10, to dissociate the ozone into $O_2$ and the oxygen radical O*. By way of example but not limiting the present disclosure, the anneal in the oxygen-containing ambient can be performed at a temperature equal to or greater than about 200° C., such as in a range from about 200° C. to about 500° C. Processing the silicon nitride layer 116 in an ozone ambient anneal treatment permits the oxygen radicals to penetrate the silicon nitride layer 116. With the oxygen radicals penetrating into the silicon nitride layer 116, the oxygen radicals can react with the silicon nitride to dope the silicon nitride layer 116 with oxygen to form a doping layer 116' having a thickness in a range about 12 Å to about 18 Å (e.g., 12, 13, 14, 15, 16, 17, or 18 Å). In other words, the loose localized backbones and structure of the silicon nitride can permit the oxygen radicals to react with the silicon nitride, which can oxidize the material and can create one or more byproducts. In some embodiments, the byproducts can include nitrogen. The byproducts can diffuse through the silicon nitride layer 116 and be outgassed.

In some embodiments, a processing temperature of the ozone heating treatment may be in a range from about 200° C. to about 500° C. By way of example but not limiting the present disclosure, the processing temperature may be about 200, 250, 300, 350, 400, 450, or 500° C. In some embodiments, a flow rate of the ozone of the ozone heating treatment may be in a range from about 2000 sccm to about 5000 sccm. By way of example but not limiting the present disclosure, the flow rate of the ozone may be about 2000, 2500, 3000, 3500, 4000, 4500, or 5000 sccm. In some embodiments, the processing pressure of the ozone heating treatment is in a range from about 12 torr to about 18 torr. By way of example but not limiting the present disclosure, the processing pressure may be about 12, 13, 14, 15, 16, 17, or 18 torr. In some embodiments, a time duration of the ozone heating treatment may be in a range from about 40 seconds to about 80 seconds. By way of example but not limiting the present disclosure, the time duration may be about 40, 45, 50, 55, 60, 65, 70, 75, or 80 seconds.

In FIG. 20B, the ozone heating treatment as shown in FIG. 19B is also performed on the silicon oxycarbide layer 114 over the substrate W2. Processing the silicon oxycarbide layer 114 in an ozone ambient anneal treatment limits the oxygen radicals penetrating the silicon oxycarbide layer 114. The oxygen radicals can only minimally react with the silicon oxycarbide to dope the silicon oxycarbide layer 114 with oxygen, so as to form a doping layer 114' having a thickness less than about 2 Å. In other words, the robust localized backbones and structure of the silicon oxycarbide can limit reaction of the oxygen radicals with the silicon oxycarbide. Therefore, the oxygen radicals from the ozone ambient may selectivity form between the silicon oxycarbide layer 114 and the silicon nitride layer 116. With reference to FIGS. 20A and 20B, using the ozone heating treatment, the different properties between the silicon oxycarbide layer 114 and the silicon nitride layer 116 may cause the oxygen radicals to dope into the silicon nitride layer 116 rather than the oxycarbide layer 114.

In certain embodiments of block S104, with reference to FIG. 6, a selective oxidation process P1 is performed on the third seal layer 146 of the multi-layered seal structure 140 over the gate stack 130. In some embodiments, the selective oxidation process P1 may be an anneal in an oxygen-containing ambient. For example, the selective oxidation process P1 may include an ozone heating method. The selective oxidation process P1 may include flowing steam ($H_2O$), oxygen ($O_2$), ozone ($O_3$), the like, or a combination thereof into a chamber in which the substrate 105 with the multi-layered seal structure 140 is disposed. In some embodiments, the ozone may be generated remotely from the substrate 105 and be flowed over the substrate 105 without subjecting the substrate 105 to plasma. Therefore, the selective oxidation process P1 can be interchangeably referred to as a non-plasma treatment. Subsequently, the selective oxidation process P1 may be performed at a predetermined heated temperature to dissociate the ozone into $O_2$ and the oxygen radical O*. By way of example but not limiting the present disclosure, the anneal in the oxygen-containing ambient can be performed at a temperature equal to or greater than about 200° C., such as in a range from about 200° C. to about 500° C.

Processing the multi-layered seal structure 140 in an oxygen-containing ambient anneal treatment permits the oxygen radicals to penetrate the multi-layered seal structure 140. The oxygen radicals from the oxygen-containing ambient may have selectivity on the third and second seal layers 146 and 144. In greater detail, the different properties between the second and third seal layers 144 and 146 in the multi-layered seal structure 140 may cause the oxygen radicals to penetrate through the third seal layer 146 and terminate at the top surface of the second seal layer 144. With the oxygen radicals penetrating into the third seal layer 146, the oxygen radicals can react with the material of the third seal layer 146 to convert the third seal layer 146 into the oxidized third seal layer 146', which may be an oxide. The loose localized backbones and structure of the third seal layer 146 can permit the oxygen radicals to react with the material of the third seal layer 146, which can oxidize the material and can create one or more byproducts. The byproducts can include nitrogen, carbon, and/or hydrogen. The byproducts can diffuse through the third seal layer 146 and be outgassed. In some embodiments, the oxidized third seal layer 146' can be interchangeably referred to as a doped seal layer with an oxygen dopant. In some embodiments, the different properties between the second and third seal layers 144 and 146 in the multi-layered seal structure 140 may cause the oxygen radicals to further dope into the second seal layer 144 with a doping thickness less than about 2 Å. With the oxygen radicals penetrating into the second seal layer 144, the oxygen radicals can react with the material of the second seal layer 144. The oxygen radicals can only minimally react with the second seal layer 144, such that second seal layer thickness loss may be less than about 2 Å. It is understood that if the oxidation process P1 is performed using an $O_2$ plasma treatment, the thickness loss of the second seal layer 144 may be significantly greater than 2 Å, even up to about 70 Å. Therefore, the ozone treatment can significantly reduce the thickness loss of the second seal layer 114, as compared to the $O_2$ plasma treatment.

Processing conditions, such as a flow rate of an oxygen-containing gas, pressure, temperature, and/or duration of exposure to the oxygen-containing ambient, can affect the extent to which the third seal layer 146 is oxidized and/or byproducts are outgassed. Hence, the processing conditions may be tuned to achieve a target material with various characteristics. For example, a composition of the oxidized third seal layer 146' may be desired to have a k-value and/or etch selectivity. By way of example but not limiting the present disclosure, varying the concentration of carbon in the oxidized third seal layer 146' relative to the oxygen can vary the k-value. For example, increasing the concentration of carbon relative to the oxygen can result in a lower k-value, and decreasing the concentration of carbon relative to the oxygen can result in a higher k-value. In some embodiments, the oxygen in the oxidized third seal layer 146' has an atomic percentage greater than or equal to about 10% (e.g., about 10%, 20%, 30%, 40%, 50%, 60%, 70%, 80%, or 90%). In some embodiments, the oxygen is evenly dispersed in the oxidized third seal layer 146'. That is, any position in the oxidized third seal layer 146' substantially has the same atomic percentage of the oxygen. In some embodiments, the oxygen in an upper portion of the oxidized third seal layer 146' has a higher atomic percentage than a lower portion of the oxidized third seal layer 146'. In other words, by way of example but not limiting the present disclosure, when silicon nitride is used as the third seal layer 146, the nitrogen in an upper portion of the oxidized third seal layer 146' has a lower atomic percentage than a lower portion of the oxidized third seal layer 146'. In some embodiments, a lower portion of the oxidized third seal layer 146' may be oxygen-free.

In some embodiments, the volume of the oxidized third seal layer 146' may be greater than the volume of the third seal layer 146, such as by up to about 10%. The oxidation of the third seal layer 146 can cause the volume of the oxidized third seal layer 146' to be expanded relative to the third seal layer 146. In some embodiments, the expansion in volume can cause the oxidized third seal layer 146' to be less dense than the third seal layer 146 to thereby result in a reduction of k-value, such that a k-value of the oxidized third seal layer 146' is less than a k-value of the third seal layer 146. By way of example but not limiting the present disclosure, when silicon nitride is used as the third seal layer 146, the lower density and increased volume caused by oxidation and transformation from a nitrogen-rich to an oxygen-rich dielectric corresponds to a reduction of k-value.

Figure 16:
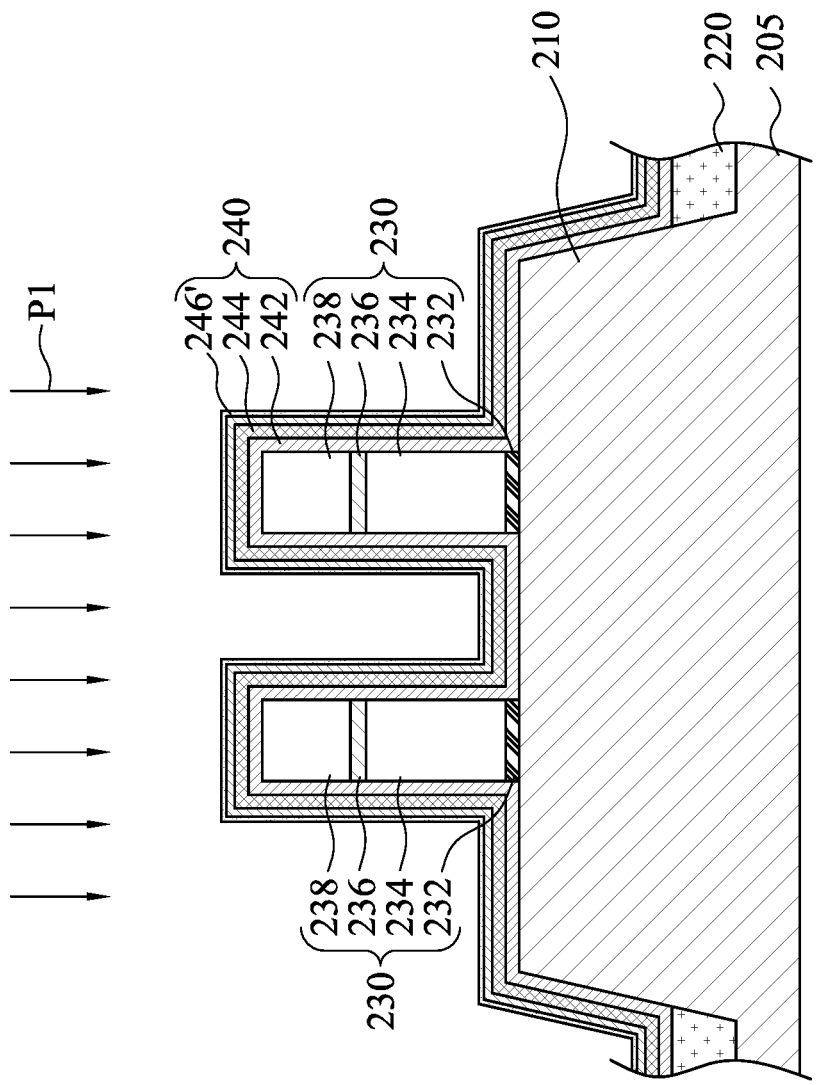
FIGS. 16 and 17 illustrate a method in various stages of forming a semiconductor device in accordance with some embodiments of the present disclosure.
Figure 17:
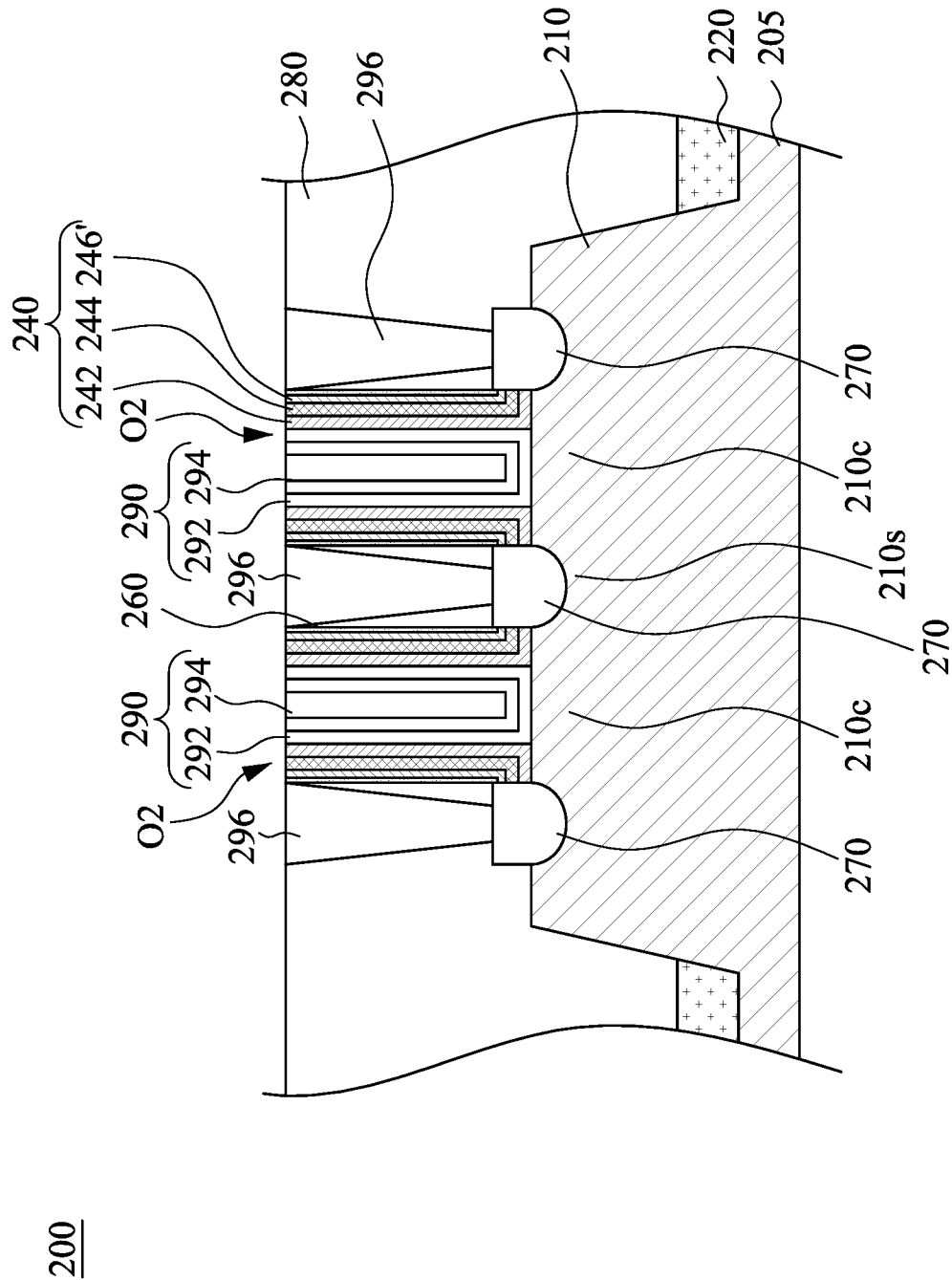

Some example compositions are described in FIGS. 16 and 17. Further, a UV treatment may be performed, such as in processes with low thermal budgets, to enhance reactions with the oxygen radicals and to provide for further cross-linking in the oxidized third seal layer 146', which can increase the strength and structural integrity of the oxidized third seal layer 146'.

In some examples, the oxidized third seal layer 146' may be made of silicon oxynitride ($SiO_xN_y$), silicon oxycarbide ($SiO_xC_y$), silicon oxycarbide nitride ($SiO_xC_yN_z$), or the like. By way of example but not limiting the present disclosure, the oxidized third seal layer 146' may be made of silicon oxynitride ($SiO_xN_y$) with an atomic ratio of oxygen to silicon (O:Si) equal to or greater than about 20%, oxygen at an atomic concentration in a range from about 20% atomic percent (at. %) to about 50% at. % (e.g., 20, 25, 30, 25, 40, 45, or 50), and nitrogen at an atomic concentration in a range from about 14% atomic percent (at. %) to about 21% at. %. The silicon oxynitride ($SiO_xN_y$) may have a wet etch rate in diluted hydrofluoric acid (dHF) in a range from about 0.5 to about 0.7 times the wet etch rate of silicon dioxide ($SiO_2$).

In some embodiments, a processing temperature of the selective oxidation process P1 may be in a range from about 200° C. to about 500° C. By way of example but not limiting the present disclosure, the processing temperature may be about 200, 250, 300, 350, 400, 450, or 500° C. In some embodiments, a flow rate of the oxygen-containing ambient of the selective oxidation process P1 may be in a range from about 2000 sccm to about 5000 sccm. By way of example but not limiting the present disclosure, the flow rate of the oxygen-containing ambient may be about 2000, 2500, 3000, 3500, 4000, 4500, or 5000 sccm. In some embodiments, the processing pressure of the selective oxidation process P1 is in a range from about 12 torr to about 18 torr. By way of example but not limiting the present disclosure, the processing pressure may be about 12, 13, 14, 15, 16, 17, or 18 torr. In some embodiments, a time duration of the selective oxidation process P1 may be in a range from about 40 seconds to about 80 seconds. By way of example but not limiting the present disclosure, the time duration may be about 40, 45, 50, 55, 60, 65, 70, 75, or 80 seconds. In some embodiments, forming the third seal layer 146 and the selective oxidation process P1 are in-situ performed. In some embodiments, forming the third seal layer 146 and the selective oxidation process P1 are ex-situ performed.

Figure 7:
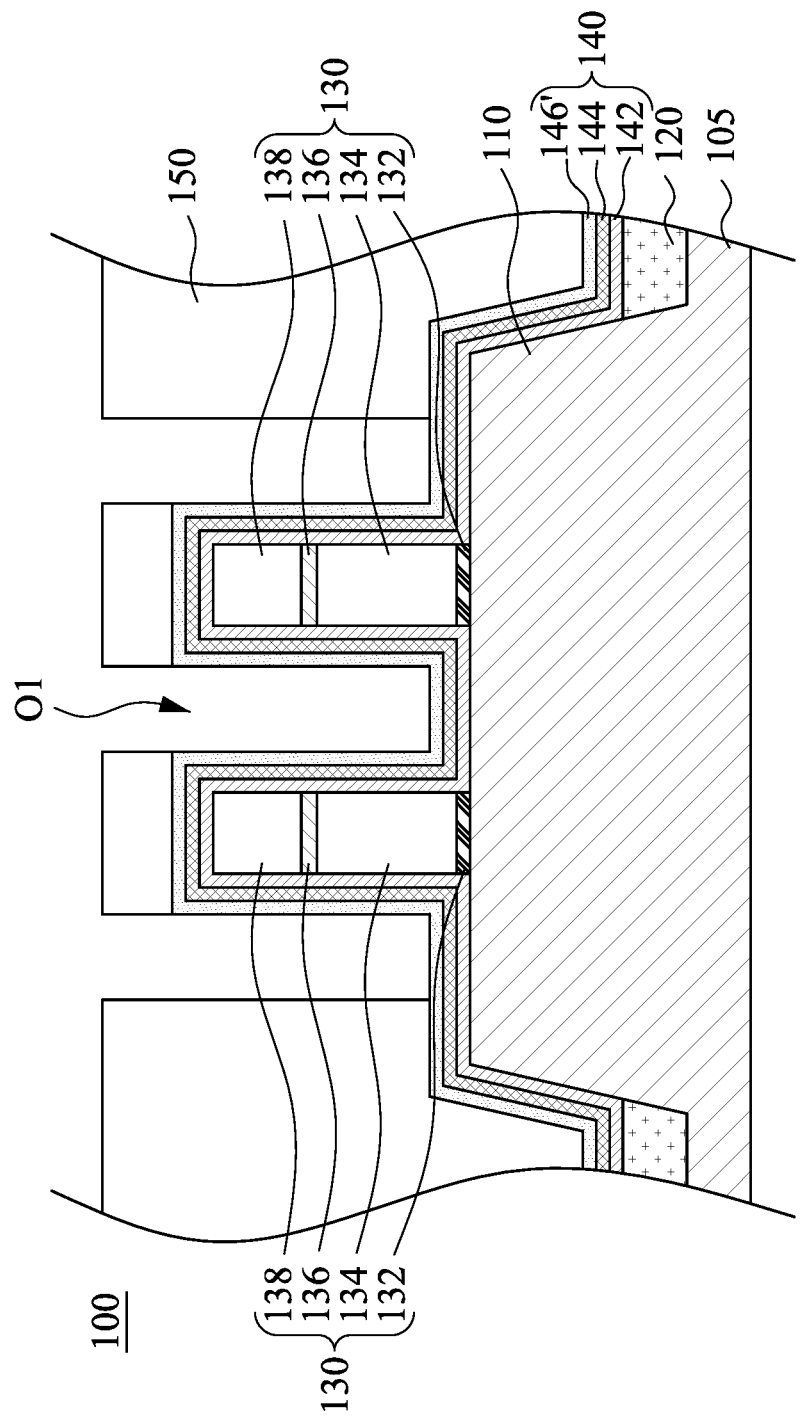

Referring back to FIG. 2, the method M then proceeds to block S105 where a patterned photo resist layer is formed over the multi-layered seal structure. With reference to FIG. 7, in some embodiments of block S105, a photo resist layer 150 is formed over the structure shown in FIG. 6. In some embodiments, the photo resist layer 150 is a DUV resist such as a krypton fluoride (KrF) resist or an argon fluoride (ArF) resist. In some embodiments, the photo resist layer 150 is an I-line resist, an EUV resist, an electron beam (e-beam) resist, or an ion beam resist. In some embodiments, the photo resist layer 150 is a positive resist. The positive resist is insoluble in a developer but becomes soluble upon radiation. One exemplary positive resist is a chemically amplified resist (CAR) that contains a backbone polymer protected by acid labile groups (ALGs) and further contains photo-acid generators (PAGs). The PAGs can produce an acid upon radiation and the acid can catalyze the cleaving of the ALGs from the backbone polymer, increasing the polymer's solubility to a positive tone developer. In some embodiments, the photo resist layer 150 is a negative resist. The negative resist is soluble in a developer but becomes insoluble upon radiation. In some embodiments, the photo resist layer 150 is formed by spin coating a resist material, followed by a baking process, such as a soft baking process and a hard baking process (which may also be referred to as a pre-exposure baking process).

By way of example but not limiting the present disclosure, the soft baking process and/or the hard baking process is performed at or below about 120 degrees Celsius. In some embodiments, the soft baking process and/or the hard baking process is performed at or below about 150 degrees Celsius. Subsequently, the photo resist layer 150 is exposed to a radiation through a mask (not shown). In some embodiments, the radiation is a DUV radiation, such as that performed using a KrF excimer laser (248 nm) or an ArF excimer laser (193 nm). Alternatively, the radiation may be an I-line (365 nm), a EUV radiation (e.g., 13.8 nm), an e-beam, an x-ray, an ion beam, or other suitable radiations. The radiation causes the PAGs in the photo resist layer 150 to produce an acid. The exposure may be performed in air, in a liquid (immersion lithography), or in a vacuum (e.g., for EUV lithography and e-beam lithography). In some embodiments, after exposing the photo resist layer 150 to the radiation, the exposed photo resist layer 150 undergoes one or more post-exposure baking (PEB) processes. In some embodiments, the PEB process is performed at or below about 150 degrees Celsius.

After undergoing a developing process in a developer, portions of the exposed photo resist layer 150 are removed, resulting in a patterned photo resist layer 150 as shown in FIG. 7. The patterned photo resist layer 150 acts as an etch mask to protect the rest of the multi-layered seal structure 140 and the semiconductor fin 110 from the subsequent etching process. The patterned photo resist layer 150 has an opening O1 to expose the multi-layered seal structure 140. In some embodiments, a developer includes a water based developer, such as tetramethylammonium hydroxide (TMAH) for a positive tone development (PTD). In other embodiments, a developer may include an organic solvent or a mixture of organic solvents, such as methyl a-amyl ketone (MAK) or a mixture involving the MAK, for a negative tone development (NTD). Applying a developer includes spraying the developer on the exposed photo resist layer 150. By way of example but not limiting the present disclosure, this may be realized by utilizing a spin-on process. The developing process may further include a post-develop baking (PDB) process.

Figure 8:
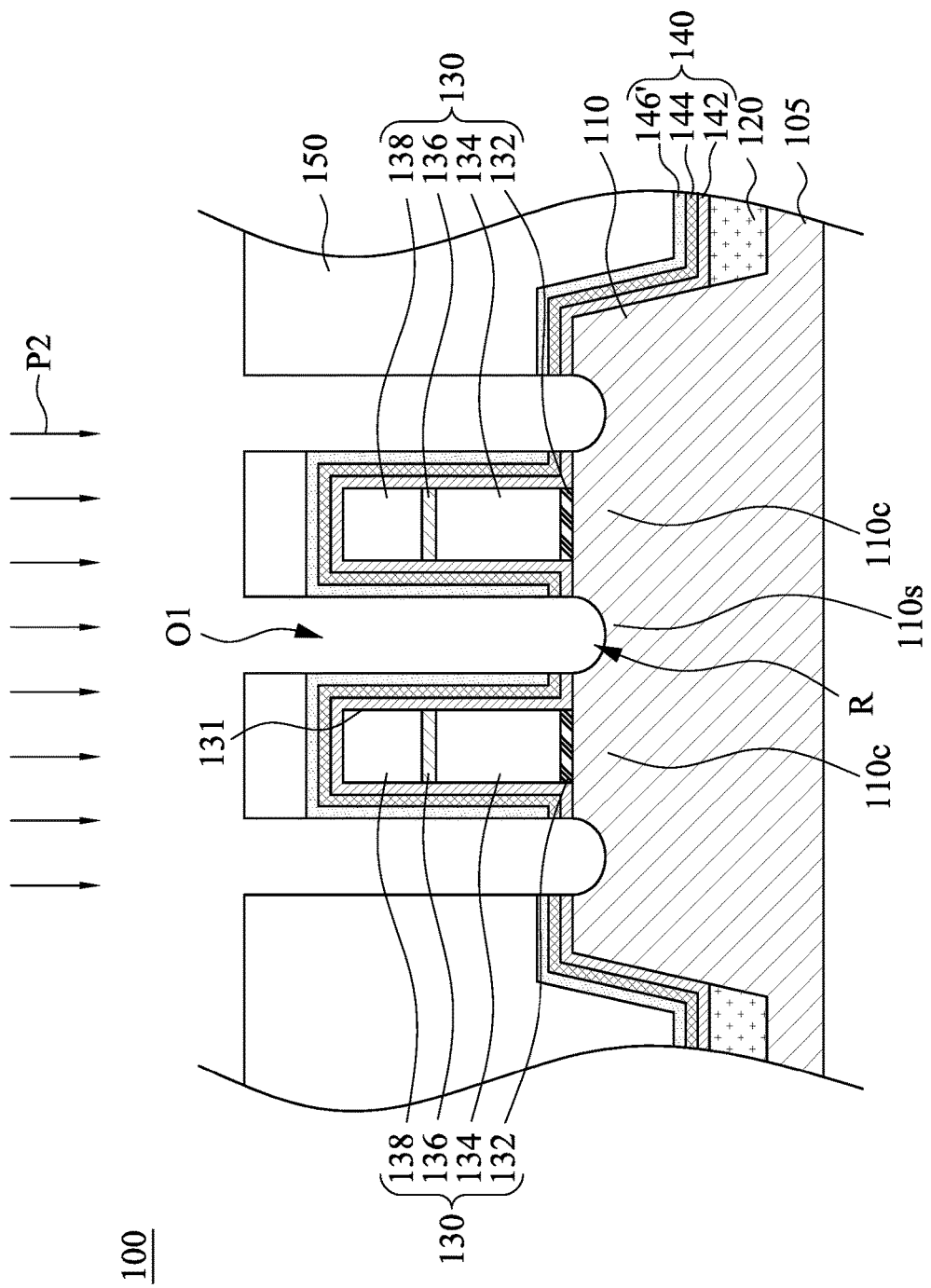

Referring back to FIG. 2, the method M then proceeds to block S106 where at least one etching process is performed to remove portions of multi-layered seal structure and semiconductor fin through the patterned photo resist layer. With reference to FIG. 8, in some embodiments of block S106, the patterned photo resist layer 150 acts as an etch mask to protect the rest of the multi-layered seal structure 140 and the semiconductor fin 110 from the etching process. The etching process P2 is performed to remove portions of the multi-layered seal structure 140. The etching process P2 may be, for example, an anisotropic etching process. The etching process P2 may include a single step or multiple steps.

In some embodiments, the etching process is a dry etching process. By way of example but not limiting the present disclosure, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof.

Subsequently, portions of the semiconductor fin 110 exposed by the dummy gate stacks 130 and the etched multi-layered seal structure 140 are removed (or recessed) to form recesses R in the semiconductor fin 110. Any suitable amount of material may be removed. The remaining semiconductor fin 110 has a plurality of source/drain portions 110s and a channel portion 110c between the source/drain portions 110s. Portions of the source/drain portions 110s are exposed by the recesses R. The channel portions 110c respectively underlie the dummy gate stacks 130. In some embodiments, the semiconductor fin 110 can be etched using a dry etching process. In some embodiments, the etching process is a dry etching process, such as a reactive ion etch (RIE) process. By way of example but not limiting the present disclosure, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. Alternatively, the etching process is a wet etching process, or combination dry and wet etching process.

Figure 9:
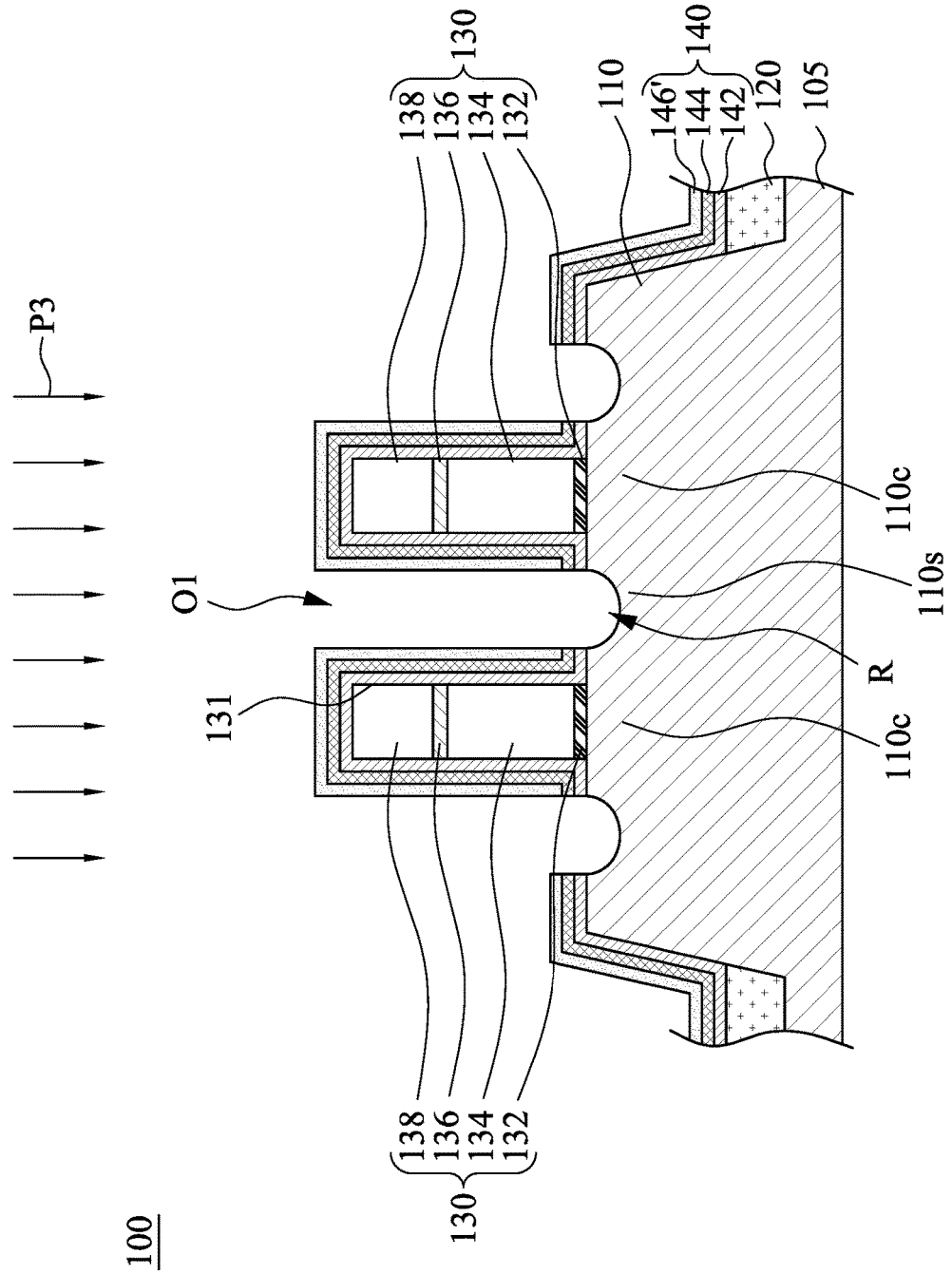

Referring back to FIG. 2, the method M then proceeds to block S107 where the patterned photo resist layer is removed. With reference to FIG. 9, in some embodiments of block S107, the patterned photo resist layer 150 is removed using an ashing process in an ambient of $N_2$, $H_2$, $O_2$ and a temperature of about 150° C. to about 350° C.

Referring back to FIG. 2, the method M then proceeds to block S108 where a clean process is performed on the substrate. With continued reference to FIG. 9, in some embodiments of block S108, a clean process P3 is performed to clean the recesses R. In some embodiments, the clean process P3 may be performed by a wet clean process, for example, using hydrofluoric acid (HF) or another suitable solution.

Figure 10:
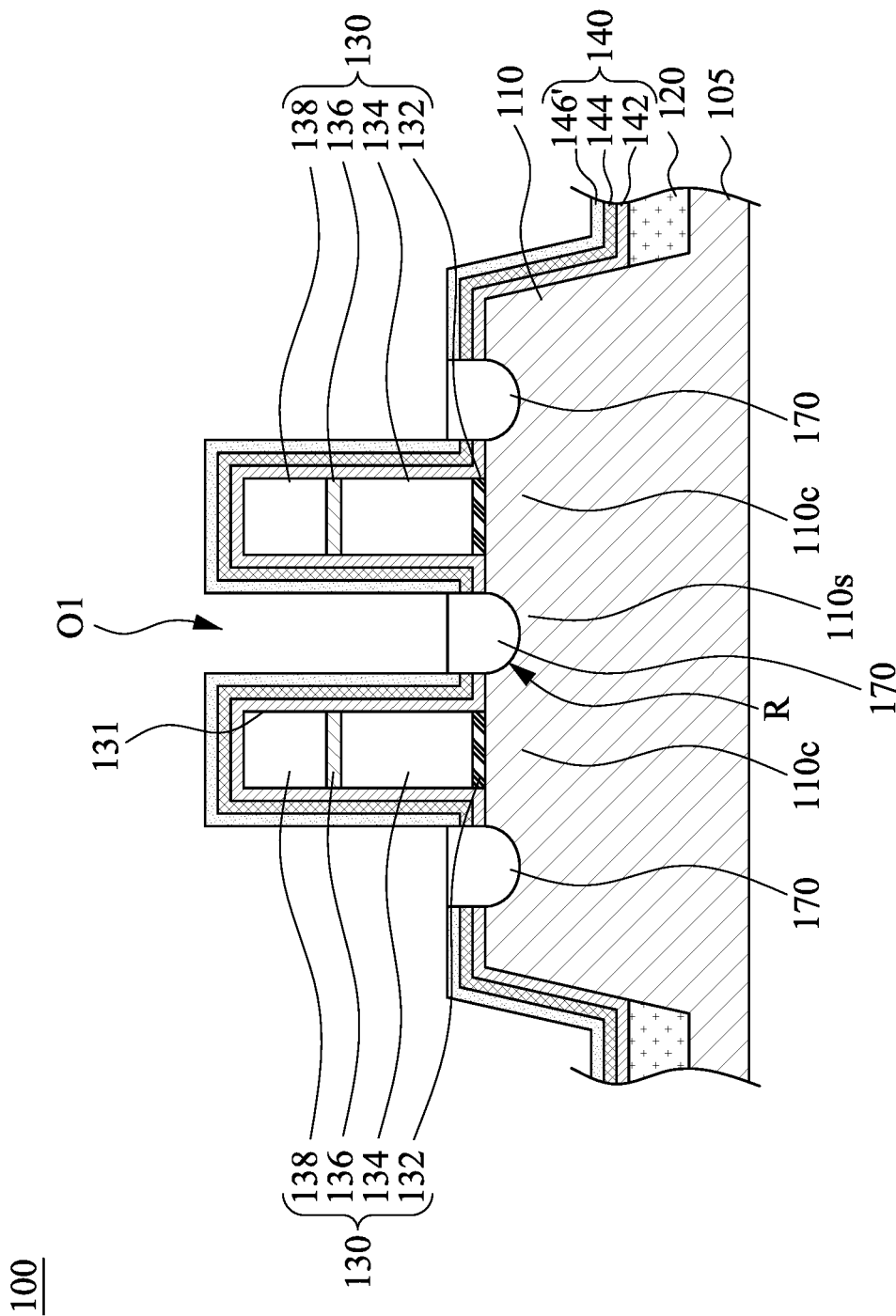

Referring back to FIG. 2, the method M then proceeds to block S109 where an epitaxy structure is formed on the semiconductor fin. With reference to FIG. 10, in some embodiments of block S109, a plurality of epitaxy structures 170 are respectively formed in the recesses R and on the source/drain portions 110s of the semiconductor fin 110. The epitaxy structures 170 may be formed using one or more epitaxy or epitaxial (epi) processes, such that Si features, SiGe features, and/or other suitable features can be formed in a crystalline state on the source/drain portions 110s of the semiconductor fin 110. In some embodiments, the lattice constants of the epitaxy structures 170 are different from the lattice constant of the semiconductor fin 110, so that the channel portions 110c of the semiconductor fin 110 can be strained or stressed by the epitaxy structures 170 to improve carrier mobility of the semiconductor device and enhance the device performance. The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the source/drain portions 110s of the semiconductor fin 110 (e.g., silicon). Thus, a strained channel can be achieved to increase carrier mobility and enhance device performance.

Figure 11:
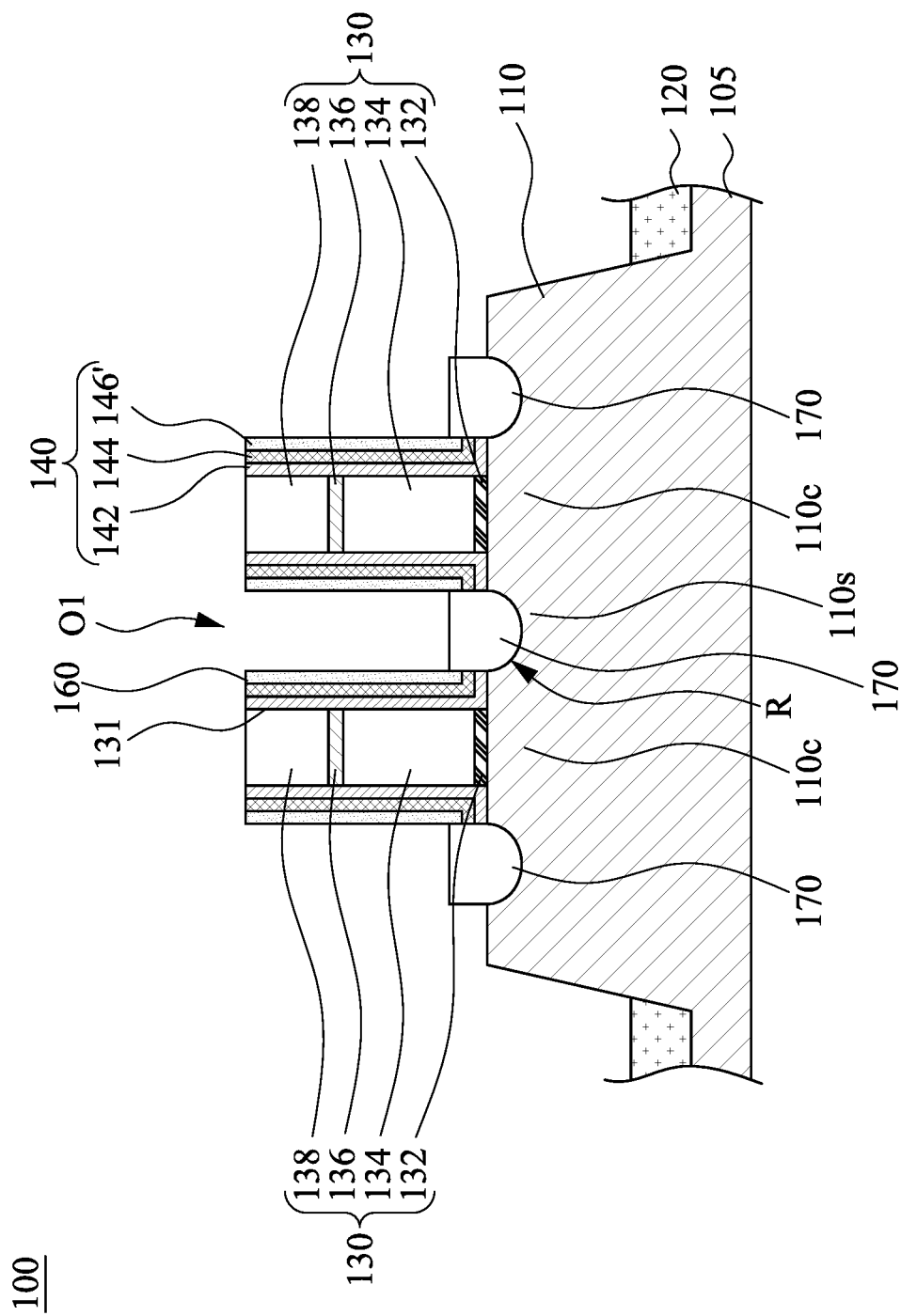

Referring back to FIG. 2, the method M then proceeds to block S110 where at least one etching process is performed to remove portions of multi-layered seal structure to form gate spacers. With reference to FIG. 11, in some embodiments of block S110, an etching process is performed to remove portions of multi-layered seal structure 140, and remaining portions of the multi-layered seal structure 140 can serve as gate spacers 160 located on opposite sides of the dummy gate stacks 130. That is, two gate spacers 160 are respectively located on two opposite sidewalls 131 of a dummy gate stack 130. The etching process may be, for example, an anisotropic etching process. The etching process P2 may include a single step or multiple steps. In some embodiments, the gate spacer 160 has the ultra-low-k seal layer 144 located between the oxidized seal layer 146' and the dummy gate stack 130, and therefore, the gate spacer 160 can be capable of resisting against the etching in the gate replacement process. In some embodiments, the gate spacers 160 may be used to offset subsequently formed epitaxy structures on the semiconductor fin 110, such as source/drain epitaxy structures. In some embodiments, the etching process is a dry etching process. By way of example and not limitation, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof.

Figure 12:
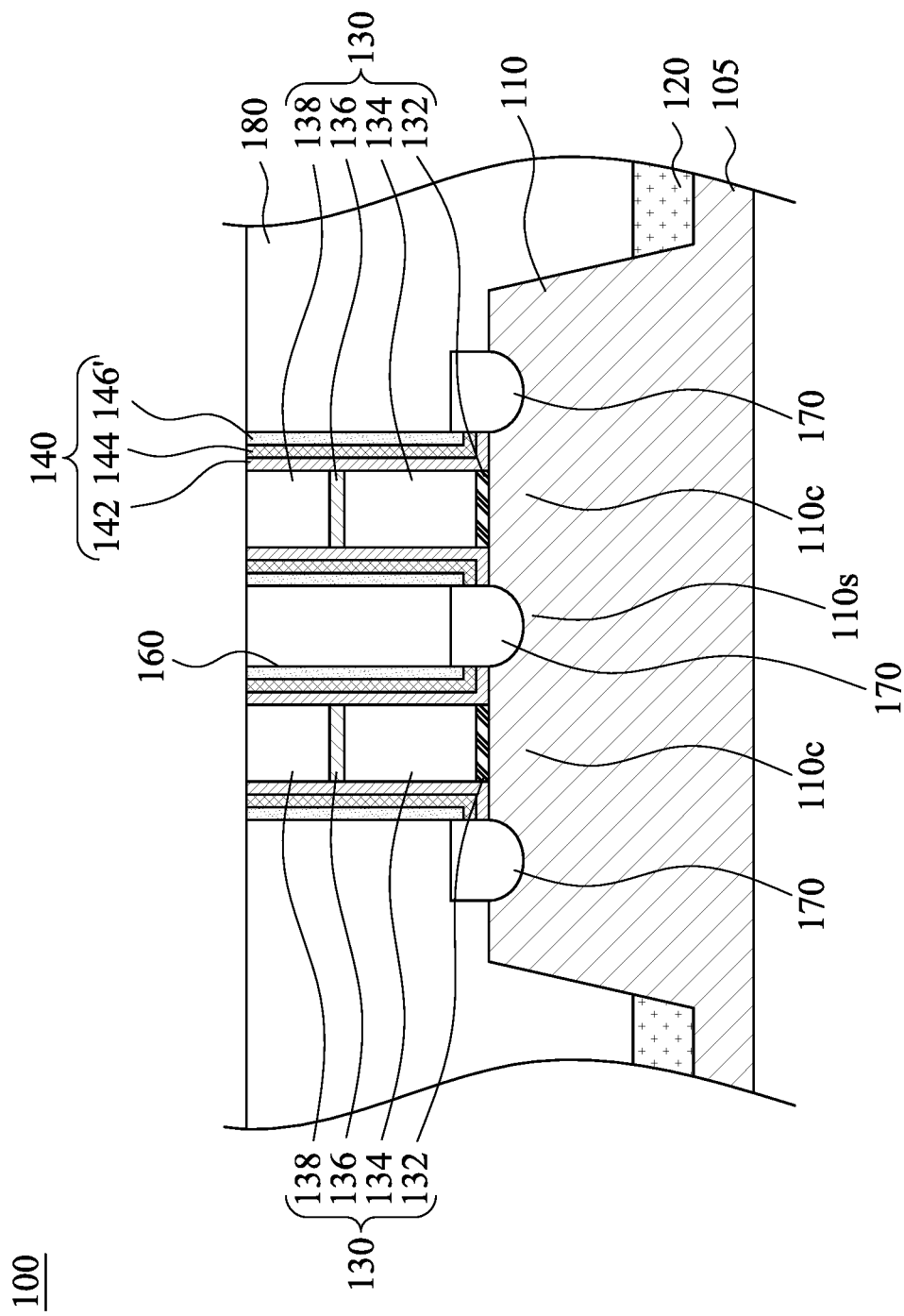

Referring back to FIG. 2, the method M then proceeds to block S110 where an interlayer dielectric (ILD) layer is formed on the substrate and covers the semiconductor fin, the dummy gate stacks, and the epitaxy structures. With reference to FIG. 12, in some embodiments of block S110, an interlayer dielectric (ILD) layer 180 is formed on the substrate 105 and covers the semiconductor fin 110, the dummy gate stacks 130, the gate spacers 160 and the epitaxy structures 170. A portion of the ILD layer 180 may be formed between the dummy gate stacks 130 and may fill the remaining space between the dummy gate stacks 130. The ILD layer 180 includes silicon oxide, silicon nitride, silicon oxynitride, silicon carbide, low-k dielectric material or a combination thereof. The ILD layer 180 includes a single layer or multiple layers. The ILD layer 180 is formed by a suitable technique, such as CVD. Afterward, a chemical mechanical polishing (CMP) process may be applied to remove excessive ILD layer 180 and expose top surfaces of the dummy gate stacks 130 to a subsequent dummy gate removal process. Moreover, this CMP process also exposes tops of the first seal layer 142, the second seal layer 144, the oxidized third seal layer 146', and the ILD layer 180.

Figure 13:
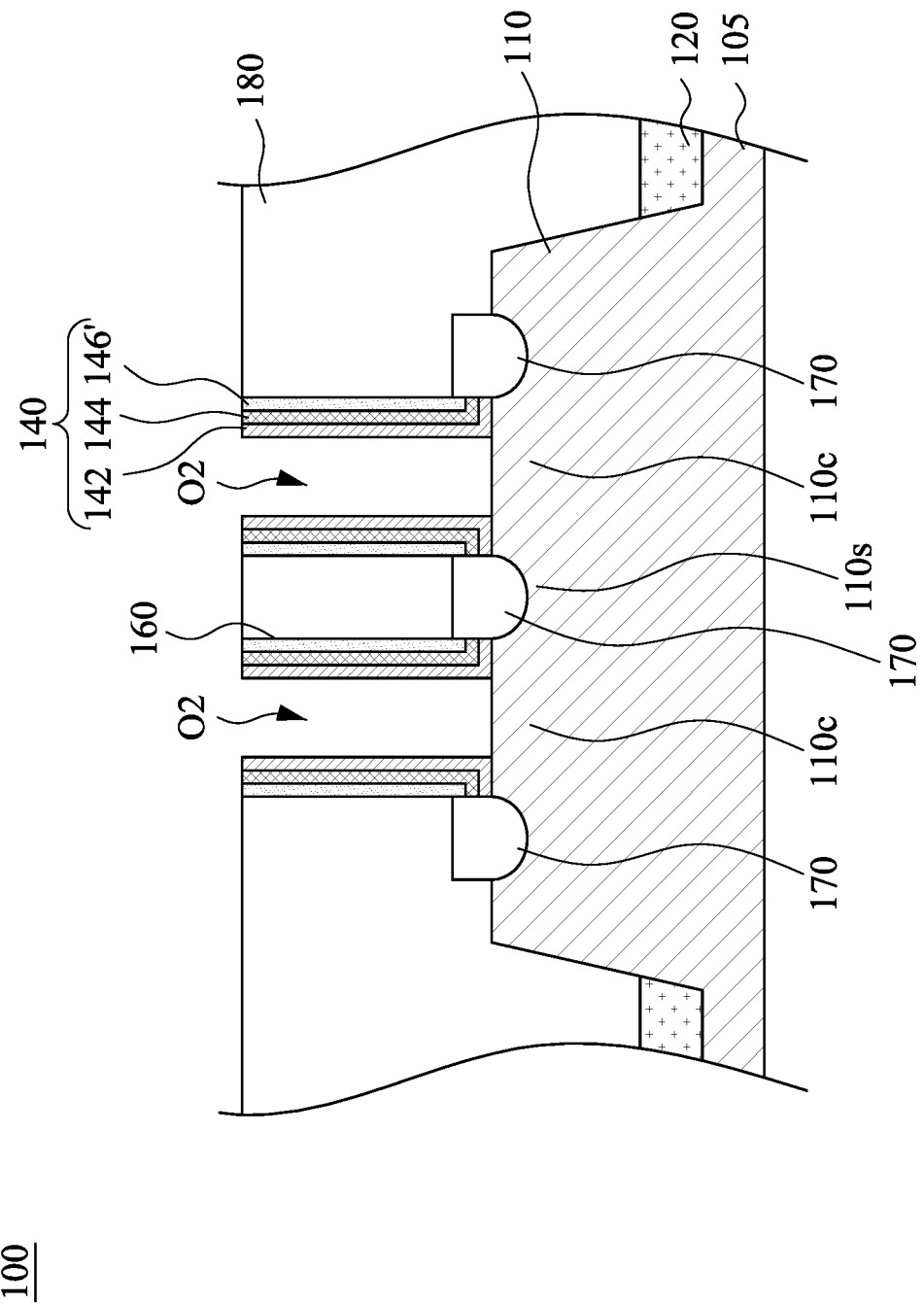

Referring back to FIG. 2, the method M then proceeds to block S111 where at least a portion of the dummy gate stack is removed to form a gate trench. With reference to FIG. 13, in some embodiments of block S111, at least portions of the dummy gate stacks 130 (see FIG. 12) are removed to form gate trenches O2 with the gate spacers 160 as their sidewalls. In some embodiments, the gate dielectrics 132, the dummy electrodes 134, the dielectric caps 136, and the gate masks 138 are removed as shown in FIG. 13. In some embodiments, the dummy electrodes 134, the dielectric caps 136, and the gate masks 138 are removed while the gate dielectrics 132 are retained. The dummy gate stacks 130 may be removed by dry etching, wet etching, or a combination of dry and wet etching. For example, a wet etching process may include exposure to a hydroxide containing solution (e.g., ammonium hydroxide), deionized water, and/or other suitable etchant solutions. In some embodiments, the first seal layer 142 of the multi-layered seal structure 140 has higher etch resistance to the etching of the dummy gate stacks 130 than that of the second seal layer 144, and therefore, the first seal layer 142 of the multi-layered seal structure 140 can protect the gate spacers 160 against the etching to form the gate trenches O2.

Figure 14:
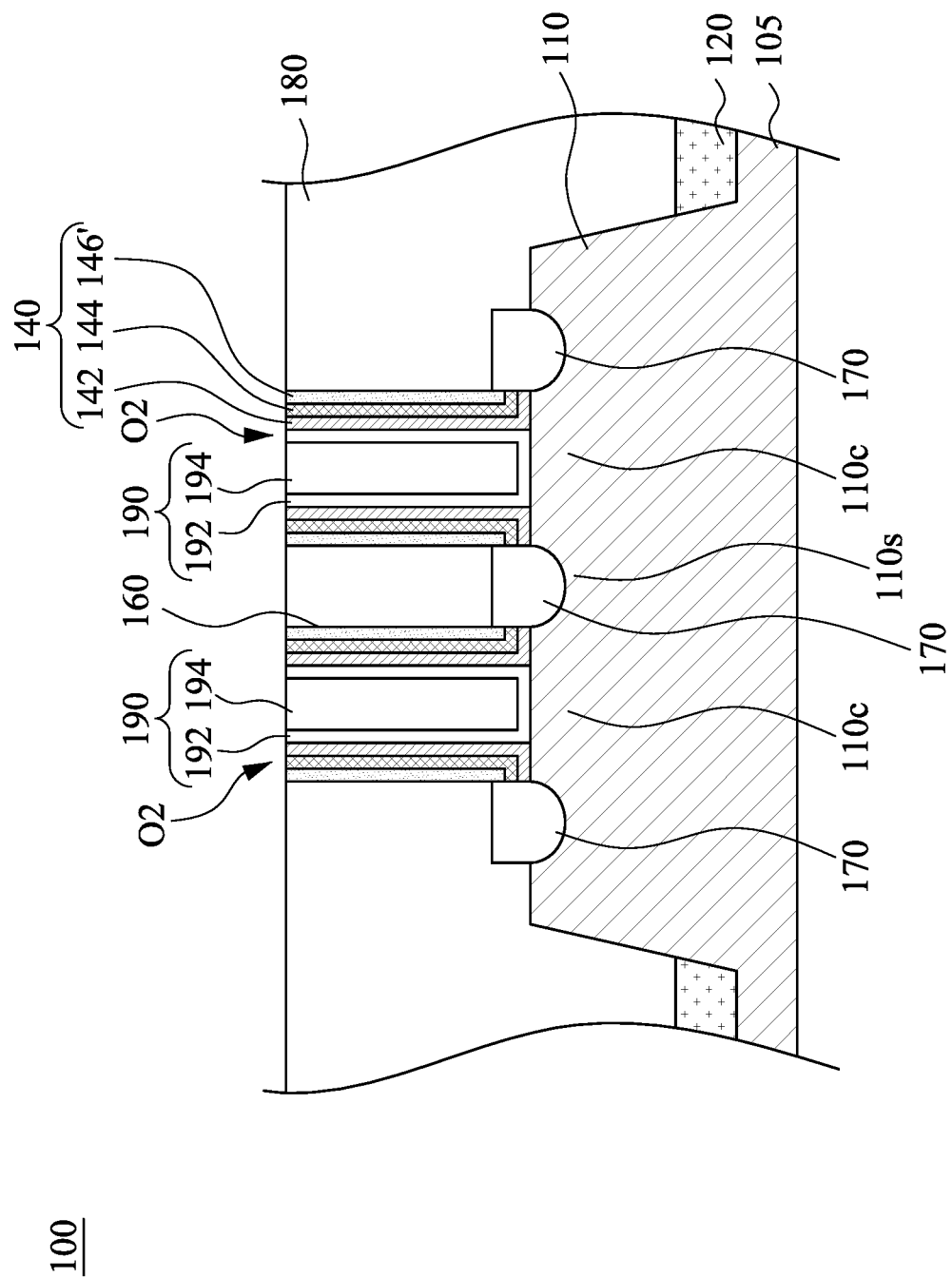

Referring back to FIG. 2, the method M then proceeds to block S112 where a replacement gate structure is formed in the gate trench. With reference to FIG. 14, in some embodiments of block S112, the replacement gate structures 190 are respectively formed in the gate trenches O2 (as shown in FIG. 13). An exemplary method of forming these replacement gate structures may include blanket forming a gate dielectric layer over the wafer W, forming one or more work function metal layers over the blanket gate dielectric layer, forming a fill metal layer over the one or more work function metal layers, and performing a CMP process to remove excessive materials of the fill metal layer, the one or more work function metal layers and the gate dielectric layer outside the gate trenches O2. As a result of this method, the replacement gate structures 190 each include a metal gate electrode 194, and a gate dielectric layer 192 which wraps around the metal gate electrode 194.

In some embodiments, the gate dielectric layer 192 may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof. In some embodiments, the gate dielectric layer 192 may include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof. In alternative embodiments, the gate dielectric layer 192 may have a multilayer structure such as one layer of silicon oxide (e.g., interfacial layer) and another layer of high-k material. In some embodiments, the gate dielectric layer 192 is made of the same material because the gate dielectric layer 192 is formed from the same dielectric layer blanket deposited over the substrate 110.

The metal gate electrode 194 includes suitable work function metals to provide suitable work functions. In some embodiments, the metal gate electrode 194 may include one or more n-type work function metals (N-metal) for forming an n-type transistor on the substrate 110. The n-type work function metals may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. In alternative embodiments, the metal gate electrode 260 may include one or more p-type work function metals (P-metal) for forming a p-type transistor on the substrate 110. The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials. At least two of the metal gate electrodes 194 are made of different work function metals so as to achieve suitable work functions in some embodiments. In some embodiments, an entirety of the metal gate electrode 194 is a work function metal.

Figure 15:
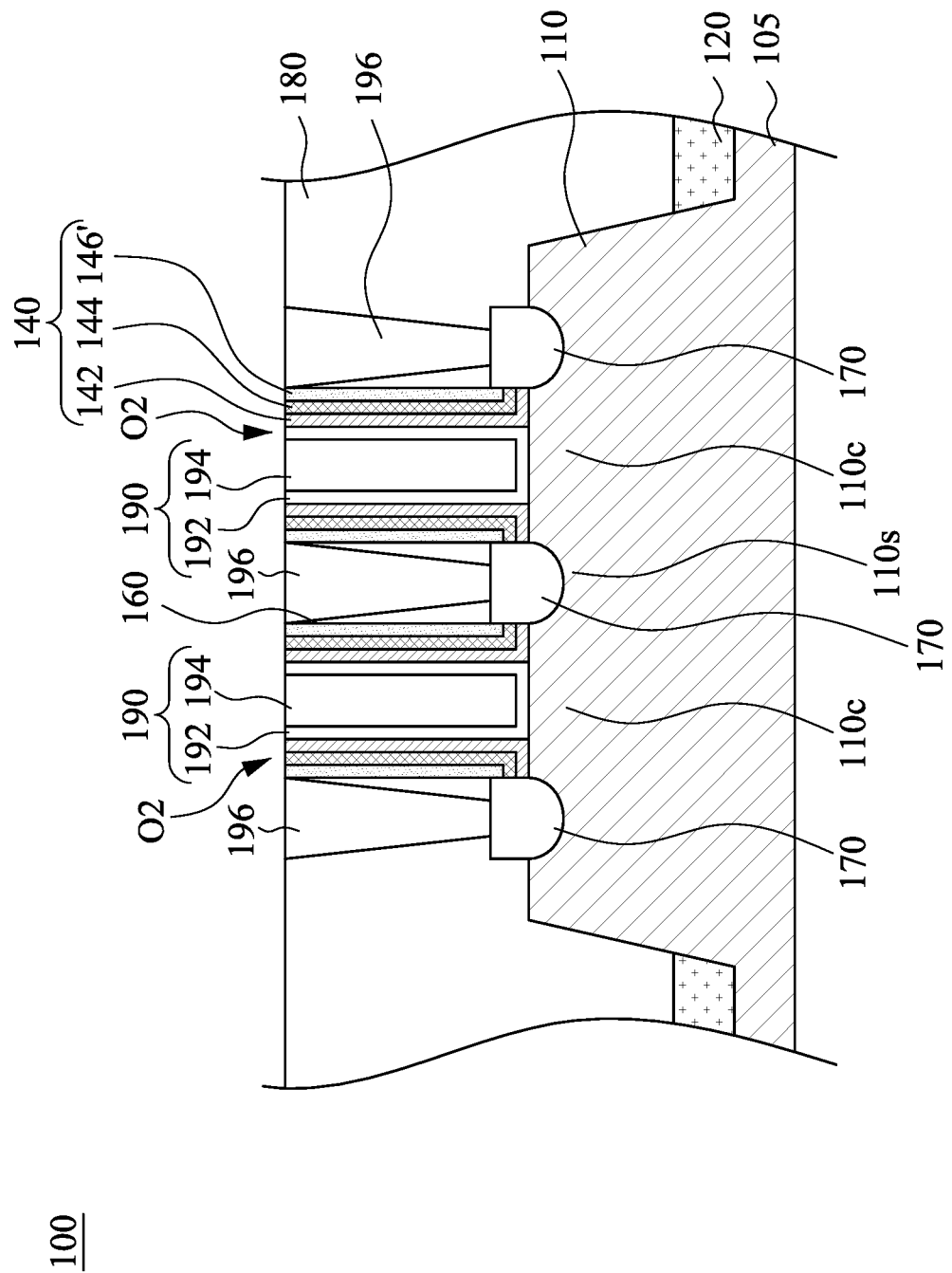

Referring back to FIG. 2, the method M then proceeds to block S113 where contact plugs are formed through the ILD layer to land on the epitaxy structures, respectively. With reference to FIG. 15, in some embodiments of block S113, contact plugs 196, are formed through the ILD layer 180, and they are in contact with tops of the epitaxy structures 170, respectively. The contact plugs 196 can thus serve as source/drain contacts. An exemplary formation method of the contact plugs 196 may include forming contact holes by one or more etching processes to sequentially etch through the ILD layer 180 down to the respective epitaxy structures 170, and depositing metal or other suitable conductive materials in the contact holes by a deposition process, such as a CVD process, to form the contact plugs 196. In some embodiments, the contact plugs 196 may include tungsten (W), aluminum (Al), copper (Cu), Cobalt (Co), another suitable conductive material, or combinations thereof.

FIGS. 16 and 17 illustrate a method in various stages of fabricating the semiconductor device 200 in accordance with some embodiments of the present disclosure. Operations for forming the semiconductor device 200 are substantially the same as the operations for forming the semiconductor device 100 described in foregoing descriptions and thus are not repeated herein for the sake of clarity. For example, materials and manufacturing processes related to a substrate 205, a semiconductor fin 210, an isolation dielectric 220, a multi-layered seal structure 240, a gate spacer 260, an epitaxy structure 270, an ILD layer 280, a gate structure 290, and a contact plug 296 may be substantially the same as those of the substrate 105, the semiconductor fin 110, the isolation dielectric 120, the multi-layered seal structure 140, the gate spacer 160, the epitaxy structure 170, the ILD layer 180, the gate structures 190, and the contact plug 196 as shown in FIGS. 3 to 15. Therefore, reference may be made to the foregoing paragraphs for the related detailed descriptions, and are not described again herein.

The difference between the present embodiment and the embodiment in FIGS. 3-15 is that the selective oxidation process P1 permits the oxygen radicals to penetrate the multi-layered seal structure 240, and the different properties between the seal layers 244 and 246 in the multi-layered seal structure 240 may cause the oxygen radicals to penetrate through the seal layer 246 and terminate prior to reaching the top surface of the seal layer 244, but not contact with the top surface of the seal layer 244 as shown in FIG. 6. Therefore, in FIG. 16, a lower portion of the seal layer 246 may be oxygen-free. In other words, by way of example but not limiting the present disclosure, when silicon nitride is used as the seal layer 246, the nitrogen in an upper portion of the oxidized third seal layer 246' has a lower atomic percentage than a lower portion of the oxidized third seal layer 246'.

Based on the above discussion, it can be seen that the present disclosure offers advantages. It is understood, however, that other embodiments may offer additional advantages, and not all advantages are necessarily disclosed herein, and that no particular advantage is required for all embodiments. In order to resist against etching processes on a gate structure, a multi-layered seal structure is formed over a gate structure. The multi-layered seal structure may have an upper seal layer and an underlying ultra-low-k seal layer. The present disclosure in various embodiments provides a non-plasma treatment, such as an ozone heating method, for forming an oxidized seal layer over the ultra-low-k seal layer. An advantage is that an oxygen radical generated from an oxygen-containing ambient, using the non-plasma treatment, may selectively oxidize the upper seal layer rather than the underlying ultra-low-k seal layer, so as to prevent damage to the underlying ultra-low-k seal layer during subsequent processes, which may in turn allow for improving the resistive-capacitive (RC) time delay of the semiconductor device.

In some embodiments, a method includes forming a gate structure on a semiconductor substrate; depositing a carbon-containing seal layer over the gate structure; depositing a nitrogen-containing seal layer over the carbon-containing seal layer; introducing an oxygen-containing precursor on the nitrogen-containing seal layer; heating the substrate to dissociate the oxygen-containing precursor into an oxygen radical to dope into the nitrogen-containing seal layer; after heating the substrate, etching the nitrogen-containing seal layer and the carbon-containing seal layer, such that a remainder of the nitrogen-containing seal layer and the carbon-containing seal layer remains on a sidewall of the gate structure. In some embodiments, introducing the oxygen-containing precursor on the nitrogen-containing seal layer is in a non-plasma state. In some embodiments, the oxygen-containing precursor comprises ozone. In some embodiments, heating the substrate is performed at a temperature in a range from about from about 200° C. to about 500° C. In some embodiments, heating the substrate is performed at a time duration in a range from about 40 seconds to about 80 seconds. In some embodiments, introducing the oxygen-containing precursor on the nitrogen-containing seal layer is performed at a flow rate in a range from about 2000 sccm to about 5000 sccm. In some embodiments, introducing the oxygen-containing precursor on the nitrogen-containing seal layer is performed at a pressure in a range from about from about 12 Torr to about 18 Torr. In some embodiments, the carbon-containing seal layer has a lower dielectric constant than the nitrogen-containing seal layer. In some embodiments, the carbon-containing seal layer is made of silicon oxycarbide. In some embodiments, the nitrogen-containing seal layer is made of silicon nitride.

In some embodiments, a method includes forming a semiconductor fin extending upwardly from a substrate; forming a shallow trench isolation (STI) structure laterally surrounding the semiconductor fin; forming a gate stack on the semiconductor fin; depositing a silicon oxycarbide layer over the gate structure; depositing a silicon nitride layer over the silicon oxycarbide layer; performing a non-plasma treatment, using ozone as a precursor, on the silicon nitride layer to dope the silicon oxycarbide layer with oxygen; after performing the non-plasma treatment, etching the silicon nitride layer and the silicon oxycarbide layer, such that a remainder of the silicon nitride layer and the silicon oxycarbide layer remains on a sidewall of the gate stack. In some embodiments, an upper portion of the silicon nitride layer has a higher oxygen atomic percentage than a lower portion of the silicon nitride layer. In some embodiments, a lower portion of the silicon nitride layer is oxygen-free. In some embodiments, an upper portion of the silicon nitride layer has a lower nitrogen atomic percentage than a lower portion of the silicon nitride layer. In some embodiments, depositing a silicon nitride layer and performing the non-plasma treatment on the silicon nitride layer are in-situ performed. In some embodiments, the method further includes depositing a silicon oxycarbonitride layer over the gate stack prior to depositing the silicon oxycarbide layer.

In some embodiments, a structure includes a semiconductor substrate, a gate structure, a silicon oxycarbonitride spacer, a silicon oxycarbide spacer, a silicon nitride spacer, and a source/drain structure. The gate structure is on the semiconductor substrate. The silicon oxycarbonitride spacer is on a sidewall of the gate structure. The silicon oxycarbide spacer is on a sidewall of the silicon oxycarbonitride spacer. The silicon nitride spacer is on a sidewall of the silicon oxycarbide spacer, wherein the silicon nitride spacer has oxygen dopants extending from an outer surface of the silicon nitride spacer toward the silicon oxycarbide spacer and terminating prior to reaching the silicon oxycarbide spacer. The source/drain structure is on the semiconductor substrate and adjacent to the gate structure. In some embodiments, an upper portion of the silicon nitride spacer has a higher oxygen atomic percentage than a lower portion of the silicon nitride spacer. In some embodiments, a lower portion of the silicon nitride spacer is oxygen-free. In some embodiments, an upper portion of the silicon nitride spacer has a lower nitrogen atomic percentage than a lower portion of the silicon nitride spacer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device, comprising:
   forming a gate structure on a substrate;
   depositing a carbon-containing seal layer over the gate structure;
   depositing a nitrogen-containing seal layer over the carbon-containing seal layer;
   after depositing the nitrogen-containing seal layer over the carbon-containing seal layer, flowing an oxygen-containing precursor in a gaseous state into a process chamber, the process chamber having the substrate therein;
   performing a heating treatment, by a heater, to anneal the oxygen-containing precursor to a temperature in a range from about 200 to 500° C. and under a pressure in a range from about from about 12 to 18 Torr, such that the oxygen-containing precursor is dissociated into an oxygen radical,
   wherein during performing the heating treatment, the oxygen radical penetrates into the nitrogen-containing seal layer to react with the nitrogen-containing seal layer in a thickness range from an upper surface of the nitrogen-containing seal layer; and
   etching the nitrogen-containing seal layer and the carbon-containing seal layer, such that a remainder of the nitrogen-containing seal layer and the carbon-containing seal layer remains on a sidewall of the gate structure as a gate spacer.

2. The method of claim 1, wherein flowing the oxygen-containing precursor is in a non-plasma state.

3. The method of claim 1, wherein the oxygen-containing precursor comprises ozone.

4. The method of claim 1, wherein the heating treatment is performed at a time duration in a range from about 40 seconds to about 80 seconds.

5. The method of claim 1, wherein flowing the oxygen-containing precursor is performed at a flow rate in a range from about 2000 sccm to about 5000 sccm.

6. The method of claim 1, wherein the carbon-containing seal layer has a lower dielectric constant than the nitrogen-containing seal layer.

7. The method of claim 1, wherein the carbon-containing seal layer is made of silicon oxycarbide.

8. The method of claim 1, wherein the nitrogen-containing seal layer is made of silicon nitride.

9. A method for forming a semiconductor device, comprising: forming a semiconductor fin extending upwardly from a substrate; forming a shallow trench isolation (STI) structure laterally surrounding a lower portion of the semiconductor fin; forming a gate stack on a upper portion of the semiconductor fin; depositing a silicon oxycarbide layer over the gate stack; depositing a silicon nitride layer over the silicon oxycarbide layer; after depositing the silicon nitride layer, flowing ozone as a precursor into a process chamber, the process chamber having the substrate therein; after flowing the ozone as the precursor into the process chamber, performing a heating treatment, by a heater, to anneal the ozone to a temperature in a range from about 200 to 500° C. and under a pressure in a range from about 12 to 18 Torr, such that the ozone is dissociated into an oxygen radical, wherein during performing the heating treatment, the oxygen radical penetrates into the silicon nitride layer to react with the silicon nitride layer in a thickness range from an upper surface of the silicon nitride layer; and after performing the heating treatment, etching the silicon nitride layer and the silicon oxycarbide layer, such that a remainder of the silicon nitride layer and the silicon oxycarbide layer remains on a sidewall of the gate stack as a gate spacer.

10. The method of claim 9, wherein an upper portion of the silicon nitride layer has a higher oxygen atomic percentage than a lower portion of the silicon nitride layer.

11. The method of claim 9, wherein depositing the silicon nitride layer and flowing the ozone to oxidize the silicon nitride layer are in-situ performed.

12. The method of claim 9, further comprising:
   depositing a silicon oxycarbonitride layer over the gate stack prior to depositing the silicon oxycarbide layer.

13. A method for forming a semiconductor device, comprising:
   forming a gate structure on a semiconductor substrate;
   forming a silicon oxycarbonitride spacer on a sidewall of the gate structure and over the semiconductor substrate;
   forming a silicon oxycarbide spacer over the silicon oxycarbonitride spacer;
   forming a silicon nitride spacer over the silicon oxycarbide spacer;
   after forming the silicon nitride spacer, flowing ozone into a process chamber, the process chamber having the semiconductor substrate therein;
   after flowing the ozone, performing a heating treatment, by a heater, to anneal the ozone to a temperature in a range from about 200 to 500° C. and under a pressure in a range from about from about 12 to 18 Torr, such that the ozone is dissociated into an oxygen radical,
   wherein during performing the heating treatment, the oxygen radical penetrates into the silicon nitride spacer to react with the silicon nitride spacer in a thickness range from an upper surface of the silicon nitride spacer; and
   forming a source/drain structure on the semiconductor substrate and adjacent to the gate structure.

14. The method of claim 13, wherein an upper portion of the silicon nitride spacer has a higher oxygen atomic percentage than a lower portion of the silicon nitride spacer.

15. The method of claim 1, wherein after etching the nitrogen-containing seal layer and the carbon-containing seal layer forming a plurality of epitaxial structures over the substrate and at opposite sides of the gate structure.

16. The method of claim 1, wherein after performing the heating treatment, a density of an upper portion of the nitrogen-containing seal layer is lower than a density of a lower portion of the nitrogen-containing seal layer.

17. The method of claim 9, wherein after etching the silicon nitride layer and the silicon oxycarbide layer, forming a plurality of epitaxial structures over the semiconductor fin and at opposite sides of the gate stack.

18. The method of claim 9, wherein after performing the heating treatment, a density of an upper portion of the silicon nitride layer is lower than a density of a lower portion of the silicon nitride layer.

19. The method of claim 13, wherein after performing the heating treatment, a density of an upper portion of the silicon nitride spacer is lower than a density of a lower portion of the silicon nitride spacer.

20. The method of claim 13, wherein the heating treatment is performed at a time duration in a range from about 40 seconds to about 80 seconds.

* * * * *